(12) United States Patent
Shinkawata

(10) Patent No.: US 8,604,553 B2
(45) Date of Patent: Dec. 10, 2013

(54) SEMICONDUCTOR DEVICE AND MANUFACTURING METHOD THEREOF

(75) Inventor: Hiroki Shinkawata, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/346,397

(22) Filed: Jan. 9, 2012

(65) Prior Publication Data

US 2012/0187500 A1 Jul. 26, 2012

(30) Foreign Application Priority Data

Jan. 20, 2011 (JP) ................................. 2011-009788

(51) Int. Cl.
*H01L 27/092* (2006.01)

(52) U.S. Cl.
USPC ............. 257/369; 257/E27.062; 257/E21.632

(58) Field of Classification Search
USPC ................... 257/E21.615, E21.632, E27.062, 257/E27.081, 365, 369, 371, 390; 438/275, 438/587
See application file for complete search history.

(56) References Cited

U.S. PATENT DOCUMENTS

| 7,772,070 B2 * | 8/2010 | Kitajima et al. ............... 438/275 |
| 2004/0042295 A1 * | 3/2004 | Fujiwara et al. .............. 365/202 |

FOREIGN PATENT DOCUMENTS

JP 2007-250705 9/2007

* cited by examiner

*Primary Examiner* — Zandra Smith
*Assistant Examiner* — Paul Patton
(74) *Attorney, Agent, or Firm* — McDermott Will & Emery LLP

(57) ABSTRACT

The present invention, in a method for manufacturing a semiconductor device having an n-channel transistor and a p-channel transistor each of which has an insulation film of a high electric permittivity, inhibits a foreign matter from adhering to the side of a gate insulation film of the n-channel transistor. Over the main surface of a semiconductor substrate, a functional n-channel transistor is formed in a p-type impurity region and a functional p-channel transistor is formed in an n-type impurity region. A plurality of first peripheral transistors formed in the region other than the functional n-channel transistor in the p-type impurity region are formed so that a peripheral n-type structure and a peripheral p-type structure may coexist in a planar view.

6 Claims, 22 Drawing Sheets

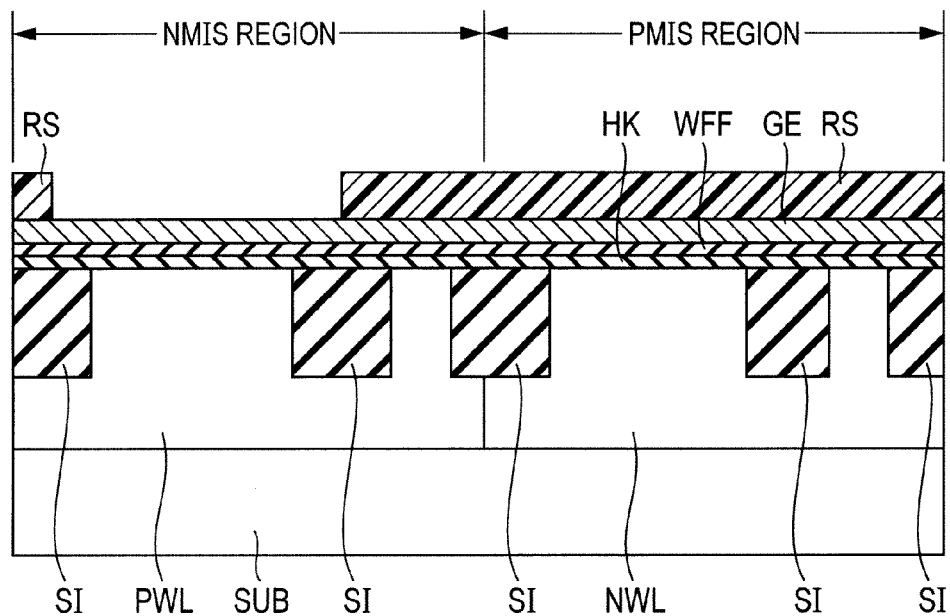
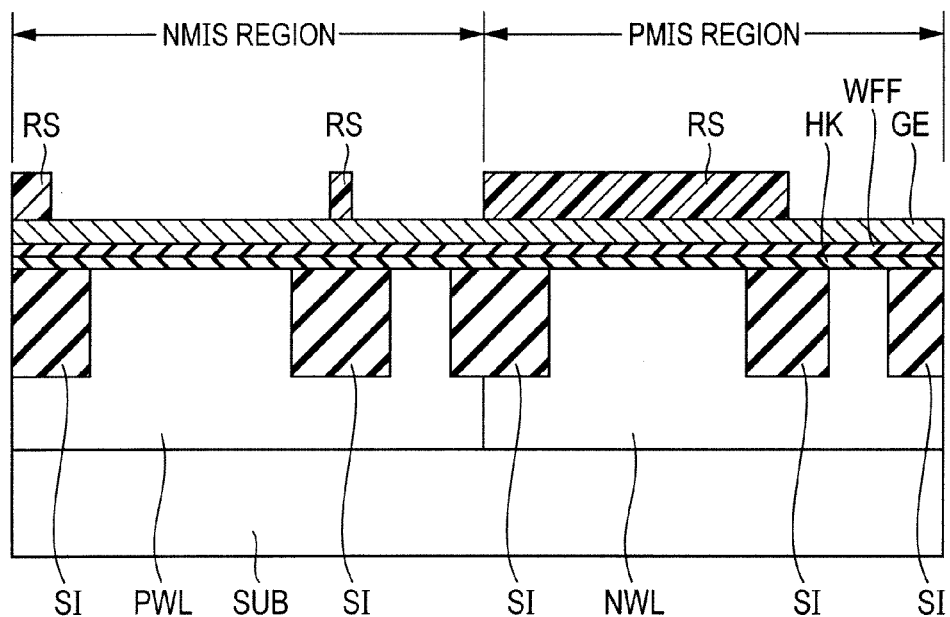

SEMICONDUCTOR DEVICE AND MANUFACTURING METHOD THEREOF

CROSS-REFERENCE TO RELATED APPLICATIONS

The disclosure of Japanese Patent Application No. 2011-9788 filed on Jan. 20, 2011 including the specification, drawings and abstract is incorporated herein by reference in its entirety.

BACKGROUND

The present invention relates: to a semiconductor device and a manufacturing method thereof; and more specifically to a semiconductor device including an n-channel transistor and a p-channel transistor having an insulation film of a high electric permittivity and a manufacturing method of the semiconductor device.

A CMIS (Complementary Metal Insulator Semiconductor) transistor having an n-channel MIS (Metal Insulator Semiconductor) transistor and a p-channel MIS transistor is widely used. In a CMIS transistor, a plurality of so-called dummy patterns that are different from legitimate transistors are arranged at the peripheries of the legitimate (functional) n-channel and p-channel transistors functioning as transistors. A dummy pattern is formed with the aim of improving the flatness of an uppermost plane at a treatment called CMP (Chemical Mechanical Polishing) to flatten the uppermost plane such as an interlayer insulation film formed in the manufacturing step of a semiconductor integrated circuit. A semiconductor integrated circuit device having a plurality of dummy patterns at the peripheries of legitimate functional circuits is disclosed in Japanese Unexamined Patent Publication No. 2007-250705 (hereunder referred to as "Patent Literature 1") for example.

PREVIOUS TECHNICAL LITERATURE

Patent Literature

[Patent Literature 1]
Japanese Unexamined Patent Publication No. 2007-250705

SUMMARY

In recent years, a CMIS transistor is required to improve the electric permittivity of a gate insulation film used for each transistor. For that reason, as a gate insulation film of a high electric permittivity, a lanthanum (La) series work function metal film is used in an n-channel transistor for example and an aluminum oxide (AlO) series work function metal film is used in a p-channel transistor for example.

A CMIS transistor having heretofore been designed is configured so as to form an n-type impurity region and a p-type impurity region in parallel over a p-type silicon substrate by forming an n-type well region and if necessary a p-type well region over the p-type silicon substrate for example. When the regions where transistors are formed are partitioned on the basis of well regions as stated above, in general the proportion of a p-type well region is about 55% to 80% of the whole region and accounts for a larger proportion than an n-type well region. For that reason, in formed transistors, the proportion of n-channel transistors is high in both legitimate functional transistors and dummy patterns.

Here, when an n-channel transistor having a lanthanum series insulation film of a high electric permittivity is formed, there is the possibility that a foreign matter may adhere to the formed insulation film if patterning is applied with a resist during the formation of the insulation film. That is, there is the possibility that a foreign matter of lanthanum fluoride (LaF) may adhere to the side (edge) part of a gate insulation film or a gate electrode when the gate insulation film is patterned by etching after an ordinary photolithographic technology. If a foreign matter of lanthanum fluoride adheres, the performance of an n-channel transistor deteriorates and defects are induced to be generated. Patent Literature 1 specifically describes neither such problems nor a means for solving the problems.

The present invention has been established in view of the above problems. An object of the present invention is, in a semiconductor device having an n-channel transistor and a p-channel transistor each of which has an insulation film of a high electric permittivity, to provide the semiconductor device to inhibit a foreign matter from adhering to the side of the gate insulation film of the n-channel transistor and a method for manufacturing the semiconductor device.

A semiconductor device according to an example of the present invention is configured as follows. The semiconductor device includes a semiconductor substrate having a main surface, a transistor forming region being formed over the main surface and having an n-type impurity region and a p-type impurity region, a functional n-channel transistor disposed in the p-type impurity region, a functional p-channel transistor disposed in the n-type impurity region, a plurality of first peripheral transistors arranged at the periphery of the functional n-channel transistor in the p-type impurity region in a planar view, and a plurality of second peripheral transistors arranged at the periphery of the functional p-channel transistor in the n-type impurity region in a planar view. At least the plural first peripheral transistors are arranged so that a peripheral n-type gate structure and a peripheral p-type gate structure may coexist.

A method for manufacturing a semiconductor device according to an example of the present invention includes the following steps. Firstly an n-type impurity region and a p-type impurity region are formed over the main surface of a semiconductor substrate. A functional n-channel transistor is formed in the p-type impurity region. A functional p-channel transistor is formed in the n-type impurity region. A plurality of first peripheral transistors are formed in a region other than the functional n-channel transistor in the p-type impurity region in a planar view. A plurality of second peripheral transistors are formed in a region other than the functional p-channel transistor in the n-type impurity region in a planar view. At least the plural first peripheral transistors are formed so that a peripheral n-type gate structure and a peripheral p-type gate structure may coexist.

By a semiconductor device and the manufacturing method thereof according to the present example, some of the first peripheral transistors have the peripheral p-type gate structure. That is, the proportion of the peripheral n-type gate structure in all the first peripheral transistors reduces. As a result, even in the case where the n-channel transistors have a lanthanum series insulation film, the possibility that a foreign matter adheres to the sides of the insulation film of the n-channel transistors reduces and the yield of the semiconductor device is inhibited from lowering.

BRIEF DESCRIPTION OF THE DRAWINGS

FIG. 4 is a sectional view showing a first step for forming the configuration shown in the sectional view of FIG. 2.

FIG. 5 is a sectional view showing a first step for forming the configuration shown in the sectional view of FIG. 3.

DETAILED DESCRIPTION

Embodiments according to the present invention are hereunder explained in reference to drawings.

(Embodiment 1)

Figure 1:
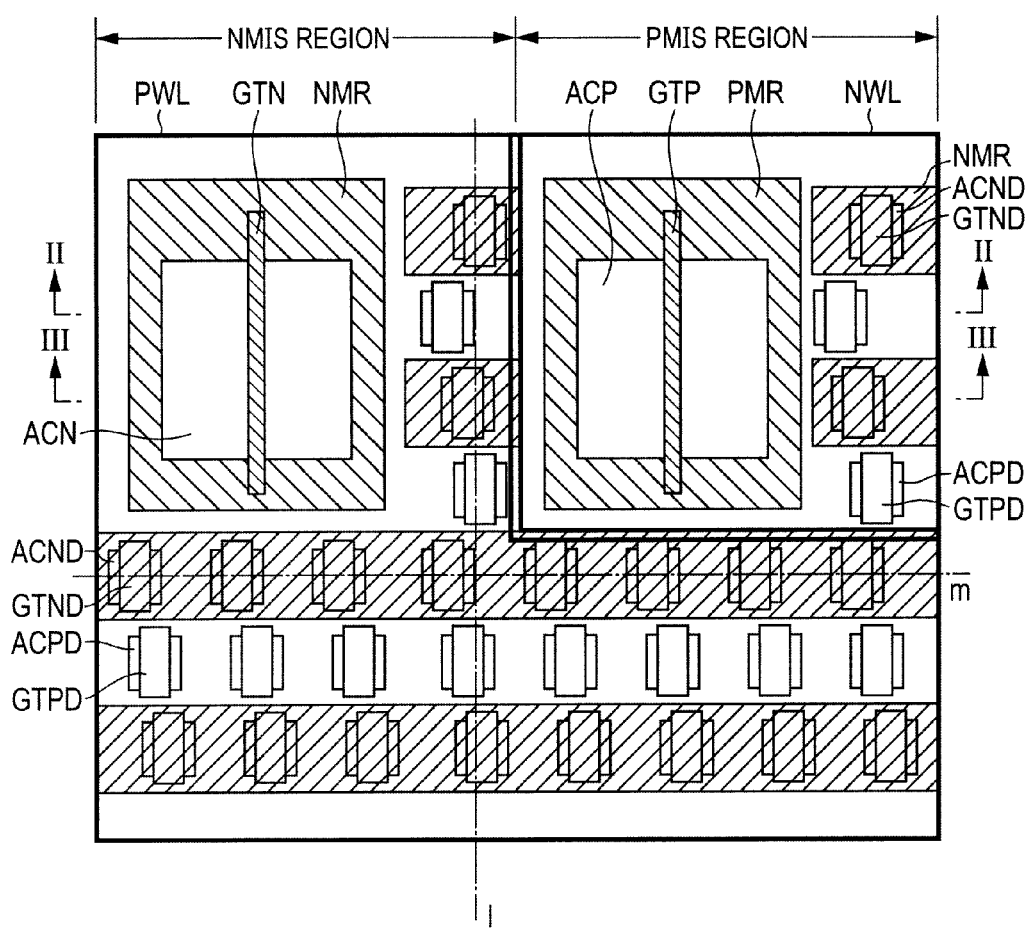
FIG. 1 is a schematic plan view showing alignment of functional transistors and dummy transistors at n-type and p-type well regions in a semiconductor device according to Embodiment 1 of the present invention.

In reference to FIG. 1, a semiconductor device according to the present embodiment is constructed by forming an NMIS region and a PMIS region over the main surface of a semiconductor substrate. For example, a nearly square region combining an NMIS region and a PMIS region shown in the planar view of FIG. 1 is formed as a transistor forming region and configures a semiconductor chip. Here, it is preferable that a semiconductor substrate comprises a p-type silicon monocrystal for example.

In the NMIS region, a p-type well region PWL (p-type impurity region) is formed so that a functional NMIS transistor (functional n-channel transistor) functioning as an n-channel transistor may be formed. In the PMIS region likewise, an n-type well region NWL (n-type impurity region) is formed so that a functional PMIS transistor (functional p-channel transistor) functioning as a p-channel transistor may be formed.

Figure 2:
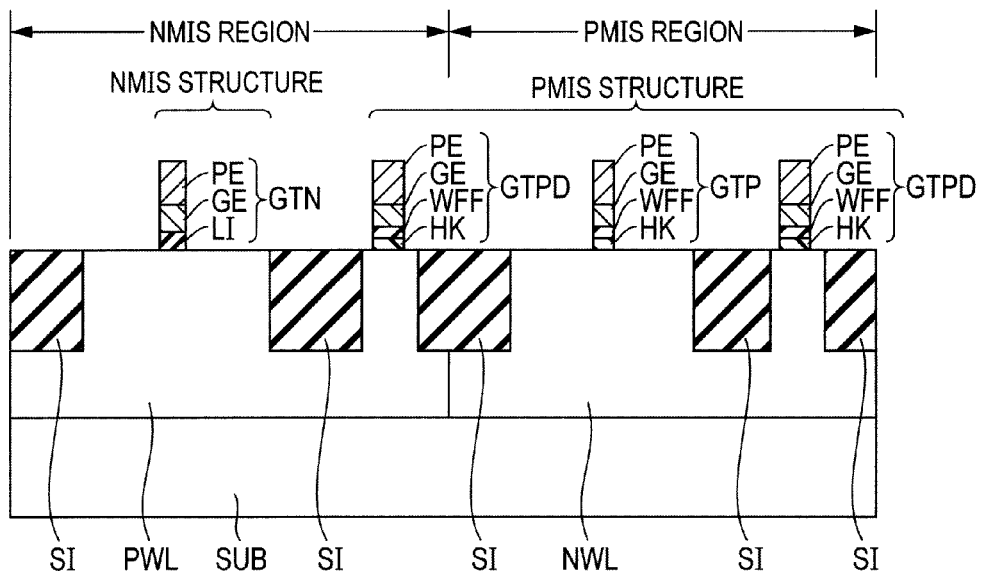
FIG. 2 is a sectional view taken on line II-II of FIG. 1 minutely showing the configuration of gate electrodes in particular.
Figure 3:
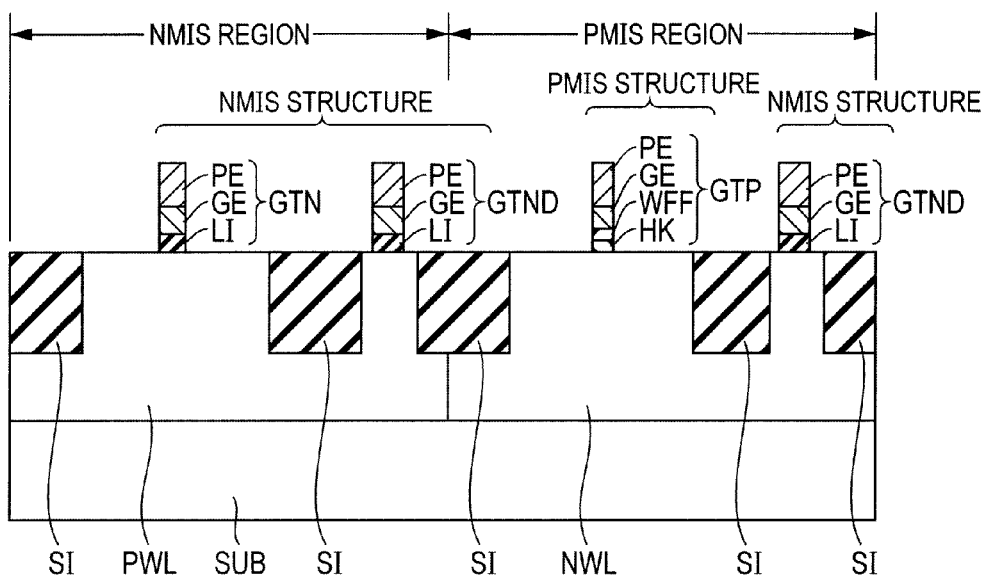
FIG. 3 is a sectional view taken on line of FIG. 1 minutely showing the configuration of gate electrodes in particular.

In reference to FIGS. 1 to 3, the functional NMIS transistor in the NMIS region has a so-called NMIS structure including an n-type active region ACN and an n-type gate electrode GTN. Here, the n-type active region ACN means a region acting as a source region and a drain region which form an n-channel MIS transistor. Then, the n-type gate electrode GTN means a region formed by combining an upper electrode and a gate insulation film thereunder which form an n-channel MIS transistor. Here, the sectional views of FIGS. 2 and 3 show the sectional structures of the gate electrodes and the active regions are not shown in the figures.

Similarly, the functional PMIS transistor in the PMIS region has a so-called PMIS structure including a p-type active region ACP and a p-type gate electrode GTP. Here, the p-type active region ACP means a region acting as a source region and a drain region which configure a p-channel MIS transistor. Then, the p-type gate electrode GTP means a region formed by combining an upper electrode and a gate insulation film thereunder which configure a p-channel MIS transistor.

In the region other than the functional NMIS transistor in the NMIS region, dummy NMIS transistors (peripheral n-type gate structures) and dummy PMIS transistors (peripheral p-type gate structures) are arranged in a mixed manner as a plurality of dummy transistors (first peripheral transistors). The first peripheral transistors refer to all of the dummy NMIS transistors and the dummy PMIS transistors formed in the NMIS region. Each of the dummy NMIS transistors has a so-called NMIS structure including a dummy n-type active region ACND and a dummy n-type gate electrode GTND. Then each of the dummy PMIS transistors has a so-called PMIS structure including a dummy p-type active region ACPD and a dummy p-type gate electrode GTPD. The dummy NMIS transistors and the dummy PMIS transistors are formed with a space between each other around the functional NMIS transistor.

In the region other than the functional PMIS transistor in the PMIS region, in the same way as the NMIS region, dummy NMIS transistors and dummy PMIS transistors are arranged in a mixed manner as a plurality of dummy transistors (second peripheral transistors). The second peripheral transistors refer to all of the dummy transistors in the PMIS region. Here, the dummy NMIS (PMIS) transistors are the same as the functional NMIS (PMIS) transistor on the point that each of them has a structure including a dummy active region, a dummy gate electrode, and a gate insulation film. Each of the dummy NMIS (PMIS) transistors however may have a structure simply being similar to a transistor but not having functions as a transistor unlike the functional NMIS (PMIS) transistor.

In reference mainly to FIG. 1, in each of the functional NMIS transistor and the dummy NMIS transistors having the NMIS structure, an NMIS structure forming region NMR (n-type opening region) is formed around each of the active regions ACN and ACND in a planar view. The NMIS structure forming region is a region where an NMIS structure having an n-type gate electrode GTN or GTND and an active region ACN or ACND is formed. Usually, an NMIS structure forming region NMR is larger than an active region ACN or ACND. That is, the functional NMIS transistor and the dummy NMIS transistors are formed inside the respective NMIS structure forming regions NMR.

Likewise, in each of the functional PMIS transistor and the dummy PMIS transistors having the PMIS structure, a PMIS structure forming region PMR (p-type forming region) is formed around each of the active regions ACP and ACPD in a planar view. The PMIS structure forming region PMR is a region where a PMIS structure having a p-type gate electrode GTP or GTPD and an active region ACP or ACPD is formed. Usually, a PMIS structure forming region PMR is larger than an active region ACP or ACPD. That is, the functional PMIS transistor and the dummy PMIS transistors are formed inside the respective PMIS structure forming regions PMR. In order to make the figures more visible, the PMIS structure forming regions PMR are not shown around the active regions ACPD of the dummy PMIS transistors. The regions other than the NMIS structure forming regions NMR in the regions where dummy transistors are formed however are the PMIS structure forming regions PMR.

In the above embodiment, both the NMIS structure forming regions NMR and the PMIS structure forming regions PMR are formed in each of the NMIS region and the PMIS region. Consequently, the dummy NMIS transistors and the dummy PMIS transistors coexist in each of the NMIS region and the PMIS region in FIG. 1.

Generally, the proportion of the area of an NMIS region is larger than that of a PMIS region over the main surface of a semiconductor substrate and, more specifically, the area of the NMIS region accounts for over 55% and below 80% of the whole transistor forming region. That is, inversely, the area of the PMIS region accounts for 20% or more to less than 45% of the whole transistor forming region. On this occasion, the sum of the areas of the NMIS structure forming regions NMR accounts for preferably 55% or less, yet preferably 50%, of the sum of the areas of the NMIS region and the PMIS region (the whole area of the transistor forming region).

In both the NMIS region and the PMIS region, in the vertical direction in FIG. 1, the plural dummy transistors are not arranged so that the gate electrodes GTND and GTPD may be aligned along a virtual straight line l but arranged so that they may positionally deviate from each other along the straight line l. In contrast, in the horizontal direction in FIG. 1, the dummy transistors are linearly aligned so that all the gate electrodes GTND and GTPD may be aligned similarly along a virtual straight line m. In order to obtain such a configuration, at the lower part of the NMIS region in FIG. 1, plural dummy NMIS transistors are allocated so that they may overlap with a linear NMIS structure forming region NMR. A PMIS structure forming region PMR as a region from which the NMIS structure forming regions NMR are excluded is also allocated in the shape of a straight line likewise and plural dummy PMIS transistors are linearly aligned so that they may overlap with a PMIS structure forming region PMR. In this way, the dummy NMIS transistors and the dummy PMIS transistors are allocated so as to be linearly aligned respectively and thus the dummy NMIS transistors and the dummy PMIS transistors coexist in the NMIS region.

In both the NMIS region and the PMIS region, the dummy transistors vertically aligned in a row on the right side of each of the functional transistors in FIG. 1 are arranged so that the dummy NMIS transistors and the dummy PMIS transistors may be aligned alternately (may be adjacent to each other). In this way, there also exist regions where dummy transistors adjacent to each other are arranged so that the same NMIS structures or the same PMIS structures may not succeed. By so doing, an implanted resist used in a photolithographic technology when the dummy active regions ACND and ACPD are formed in the relevant region can be peeled off easily. This is because the areas of the NMIS structure forming regions NMR and the PMIS structure forming regions PMR are small over the main surface and hence the adhesive force of the implanted resist to a pattern surface reduces.

In the functional NMIS transistor and the dummy NMIS transistors having the NMIS structure, each of the gate electrodes GTN and GTND has a following laminated structure. That is, in reference mainly to FIGS. 2 and 3, each of the gate electrodes GTN and GTND has a structure formed by stacking a gate insulation film LI (n-type insulation film), a metal electrode GE, and a polycrystalline silicon electrode PE in this order. Then in the functional PMIS transistor and the dummy PMIS transistors having the PMIS structure, each of the gate electrodes GTP and GTPD has a following laminated structure. That is, each of the gate electrodes GTP and GTPD has a structure formed by stacking a gate insulation film HK (p-type insulation film), a work function metal film WFF (p-type insulation film), a metal electrode GE, and a polycrystalline silicon electrode PE in this order.

The gate insulation film LI in the NMIS structure is an insulation film including lanthanum which is formed by diffusion between for example a high permittivity thin film comprising an oxide of hafnium (Hf), silicon (Si), or zirconium (Zr) and a thin film comprising lanthanum. Then the gate insulation film HK in the PMIS structure is an insulation film including aluminum which is formed by diffusion between for example a high permittivity thin film comprising an oxide of hafnium (Hf), silicon (Si), or zirconium (Zr) and for example aluminum oxide (an aluminum oxide film). Then the metal electrode GE is a thin film comprising for example titanium nitride (TiN).

Here, in the top view of FIG. 1, only the area ratios of the NMIS region and the PMIS region over the main surface of a semiconductor substrate SUB, the formation of a functional transistor in each of the regions, and the feature of the allocation of plural dummy transistors in each region are described. That is, the area occupancies, the numbers, the locations, and others of functional transistors are not shown. Specifically, although one functional NMIS transistor and one functional PMIS transistor are shown in FIG. 1, actually plural functional NMIS transistors and plural functional PMIS transistors are formed. In order to clearly demonstrate that the p-type well region PWL, the n-type well region NWL (transistor forming regions), and the MIS transistors are formed over the main surface of the semiconductor substrate SUB in the sectional views of FIGS. 2 and 3, the semiconductor substrate SUB is shown at the end of FIG. 1.

A method for manufacturing a semiconductor device having the transistor forming regions shown in FIGS. 1 to 3 according to the present embodiment is explained hereunder in reference to FIGS. 4 to 13.

In reference to FIGS. 4 and 5, firstly the main surface of a p-type silicon semiconductor substrate SUB configuring a semiconductor chip is partitioned for example into an NMIS region and a PMIS region as shown in FIGS. 1 to 3. Here, the NMIS region and the PMIS region are partitioned so that the area of the NMIS region may be preferably over 55%, yet preferably 55% and over to 80% and below, of the sum of the areas of the NMIS region and the PMIS region in a planar view.

Successively, over the main surface on one side (upper side in the figures) of the semiconductor substrate SUB, more specifically in a region of an intended thickness from the main surface on one side of the semiconductor substrate SUB to the interior, a p-type well region PWL and an n-type well region NWL are formed for example by an ordinary photolithographic technology and an ion implantation technology.

Further, a separation insulating film SI is formed around the regions where the NMIS structure and the PMIS structure are to be formed. The separation insulating film SI comprises a silicon oxide film (SiO$_2$) for example and electrically separates adjacent transistors which will be formed later.

A gate insulation film HK, a work function metal film WFF, and a metal electrode GE are formed in this order by an ordinary film forming method over the main surface of the semiconductor substrate SUB where the well regions NWL and PWL and the separation insulating film SI are formed. Subsequently, a resist pattern RS opening in the region where NMIS structure forming regions NMR of a functional NMIS transistor and dummy NMIS transistors are formed is formed by an ordinary photolithographic technology. As shown in FIG. 4, a region where the resist pattern RS does not open (region to be PMIS structure forming regions PMR) is formed even in the NMIS region. Then as shown in FIG. 5, a region where the resist pattern RS opens (region to be NMIS structure forming regions NMR) is formed even in the PMIS region. Thus finally, both the NMIS region and the PMIS region are formed so that dummy transistors of the NMIS structure and the PMIS structure may coexist.

Figure 6:
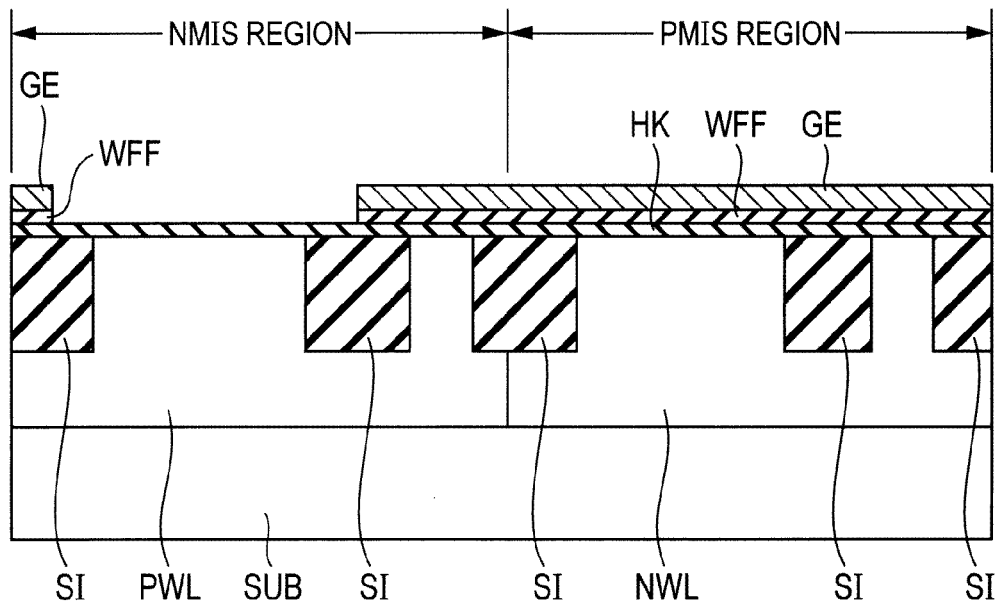
FIG. 6 is a sectional view showing a second step for forming the configuration shown in the sectional view of FIG. 2.
Figure 7:
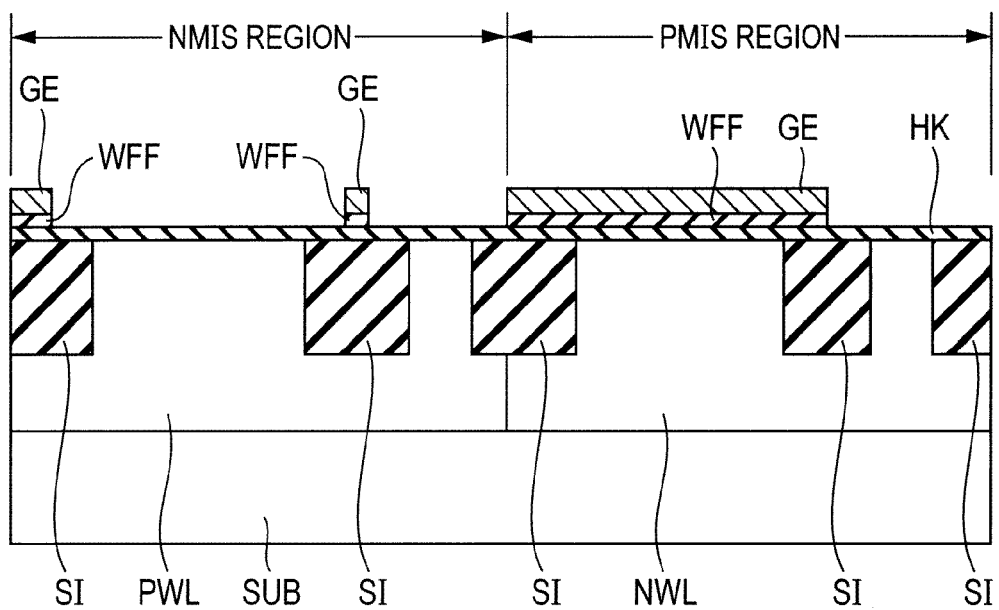
FIG. 7 is a sectional view showing a second step for forming the configuration shown in the sectional view of FIG. 3.

In reference to FIGS. 6 and 7, the metal electrode GE and the work function metal film WFF at the openings of the resist pattern RS shown in FIGS. 4 and 5 are removed by ordinary etching.

Figure 8:
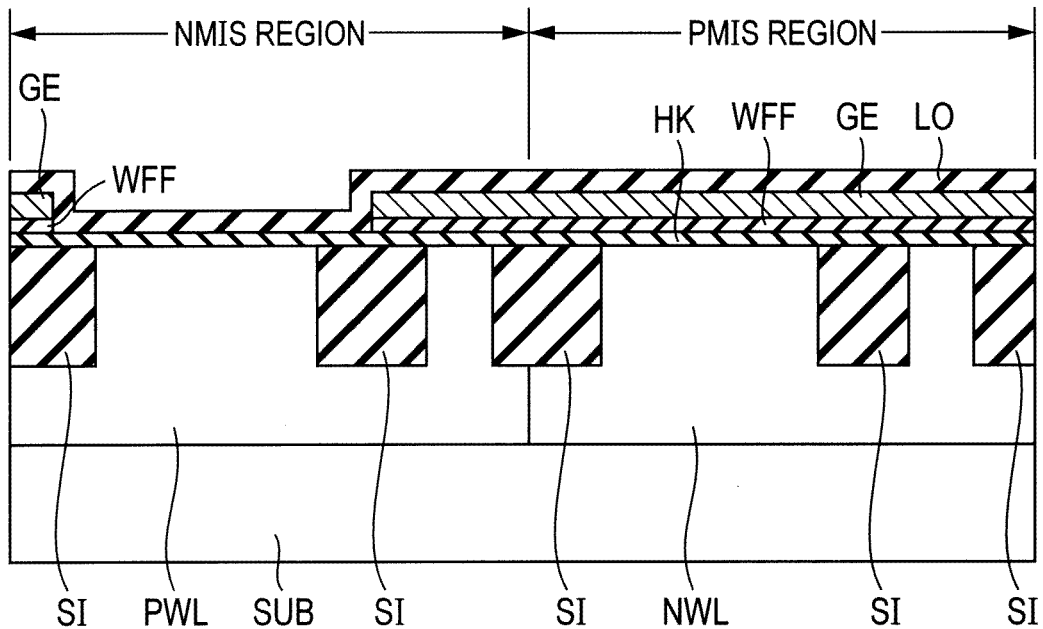
FIG. 8 is a sectional view showing a third step for forming the configuration shown in the sectional view of FIG. 2.
Figure 9:
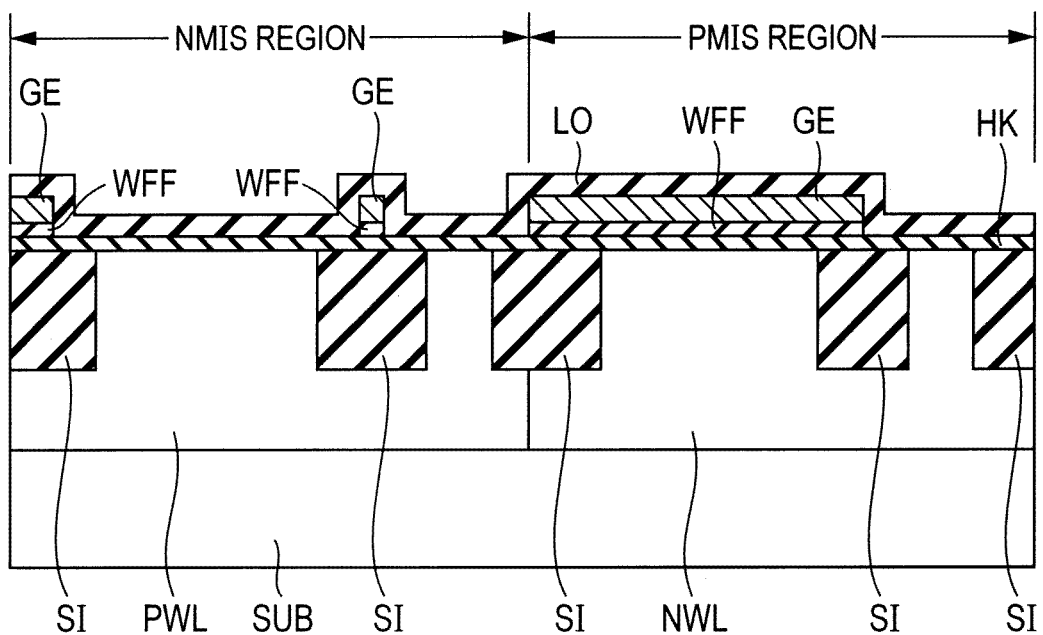
FIG. 9 is a sectional view showing a third step for forming the configuration shown in the sectional view of FIG. 3.

In reference to FIGS. 8 and 9, for example a lanthanum series thin film LO is deposited over the whole surface of the pattern formed in the step of FIGS. 6 and 7 by an ordinary film forming method.

Figure 10:
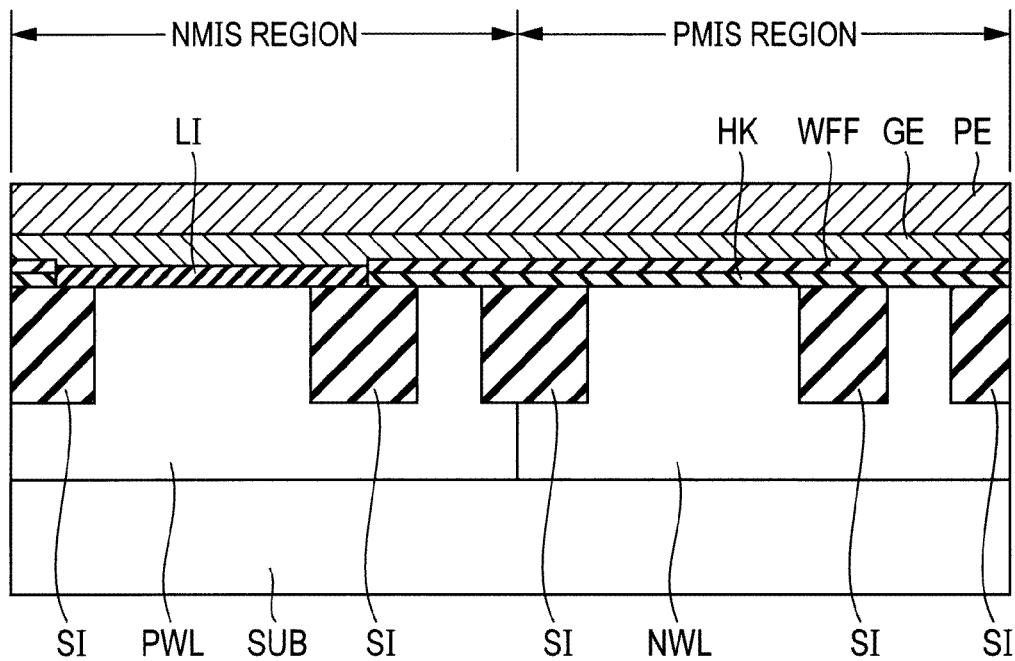
FIG. 10 is a sectional view showing a fourth step for forming the configuration shown in the sectional view of FIG. 2.
Figure 11:
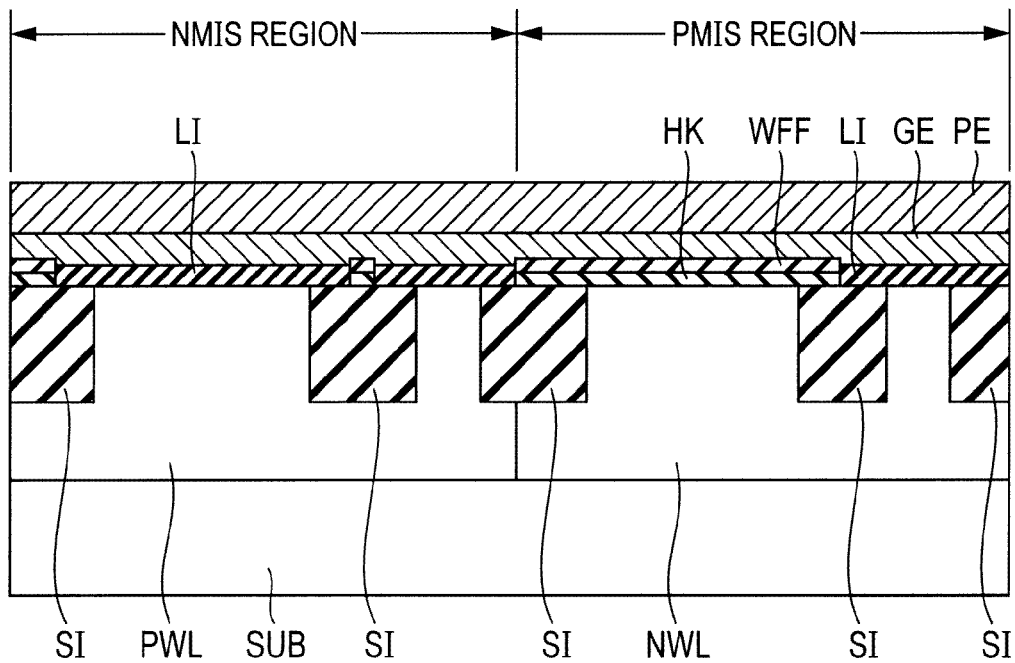
FIG. 11 is a sectional view showing a fourth step for forming the configuration shown in the sectional view of FIG. 3.

In reference to FIGS. 10 and 11, firstly in the region where the metal electrode GE and the work function metal film WFF are removed, the material configuring the lanthanum series thin film LO diffuses into the interior of the gate insulation film HK thereunder and a lanthanum insulation film LI is formed as a single insulation film. Here, the lanthanum series thin film LO diffuses so that the concentration may gradually change relative to the location of the gate insulation film HK for example by thermal diffusion.

Subsequently, the lanthanum series thin film LO over the metal electrode GE and the work function metal film WFF that have not been removed at the step of FIGS. 6 and 7 is removed. Successively, a metal electrode GE comprising the same material as the metal electrode GE and a polycrystalline silicon electrode PE are formed over the whole surface of the pattern formed here by an ordinary film forming method. Here, in FIGS. 10 and 11, the difference in thickness between the metal electrode GE over the lanthanum insulation film LI and the metal electrode GE over the work function metal film WFF is ignored.

Figure 12:
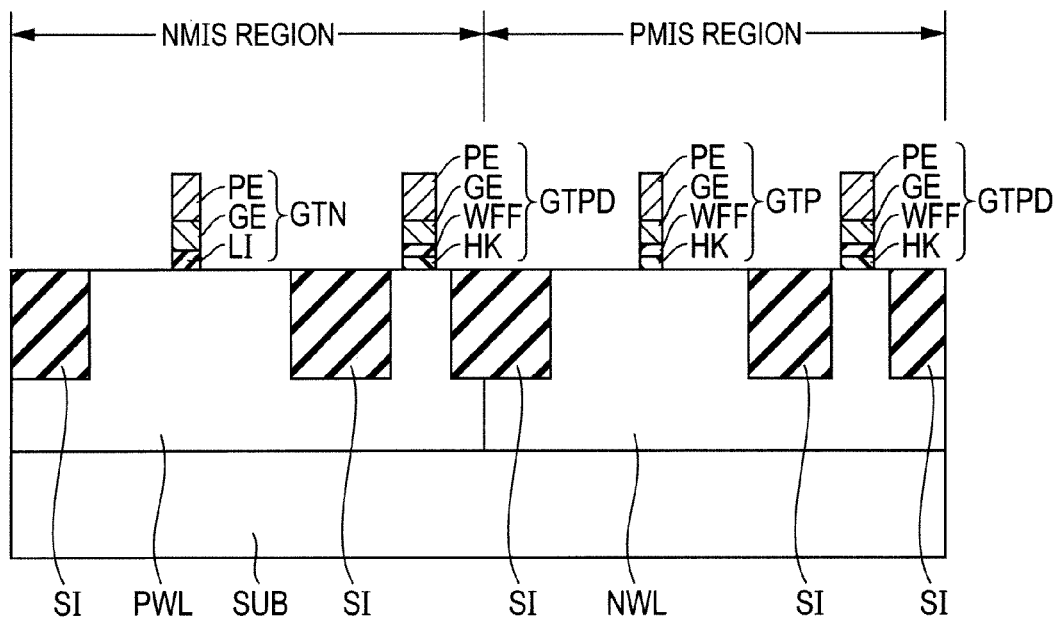
FIG. 12 is a sectional view showing a fifth step for forming the configuration shown in the sectional view of FIG. 2.
Figure 13:
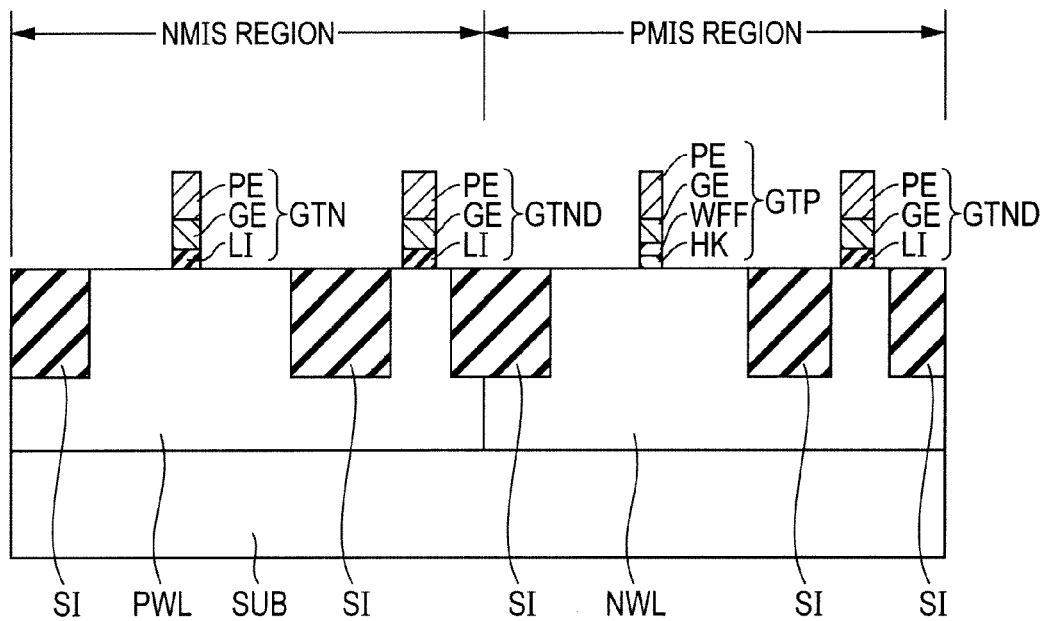
FIG. 13 is a sectional view showing a fifth step for forming the configuration shown in the sectional view of FIG. 3.

In reference to FIGS. 12 and 13, the gate insulation films HK and LI, the work function metal film WFF, the metal electrode GE, and the polycrystalline silicon electrode PE are patterned respectively by an ordinary photolithographic technology and etching. In this way, the n-type gate electrode GTN, the p-type gate electrode GTP, the dummy n-type gate electrodes GTND, and the dummy p-type gate electrodes GTPD are formed respectively. After such various kinds of gate electrodes are formed in this way, the whole semiconductor substrate SUB is cleaned.

Figure 14:
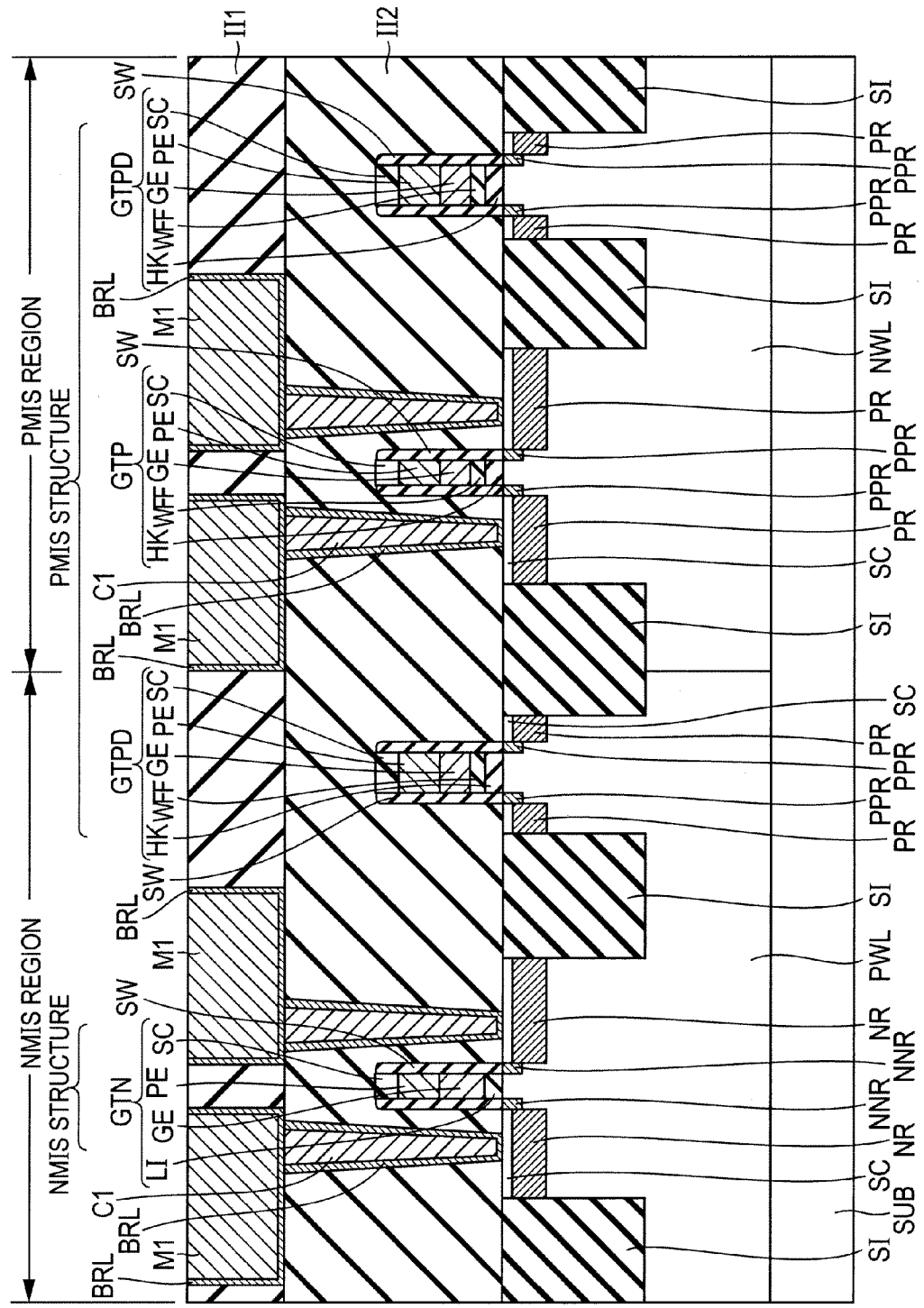
FIG. 14 is a sectional view showing the state after steps succeeding the step shown in FIG. 12 for forming the configuration shown in the sectional view of FIG. 2.
Figure 15:
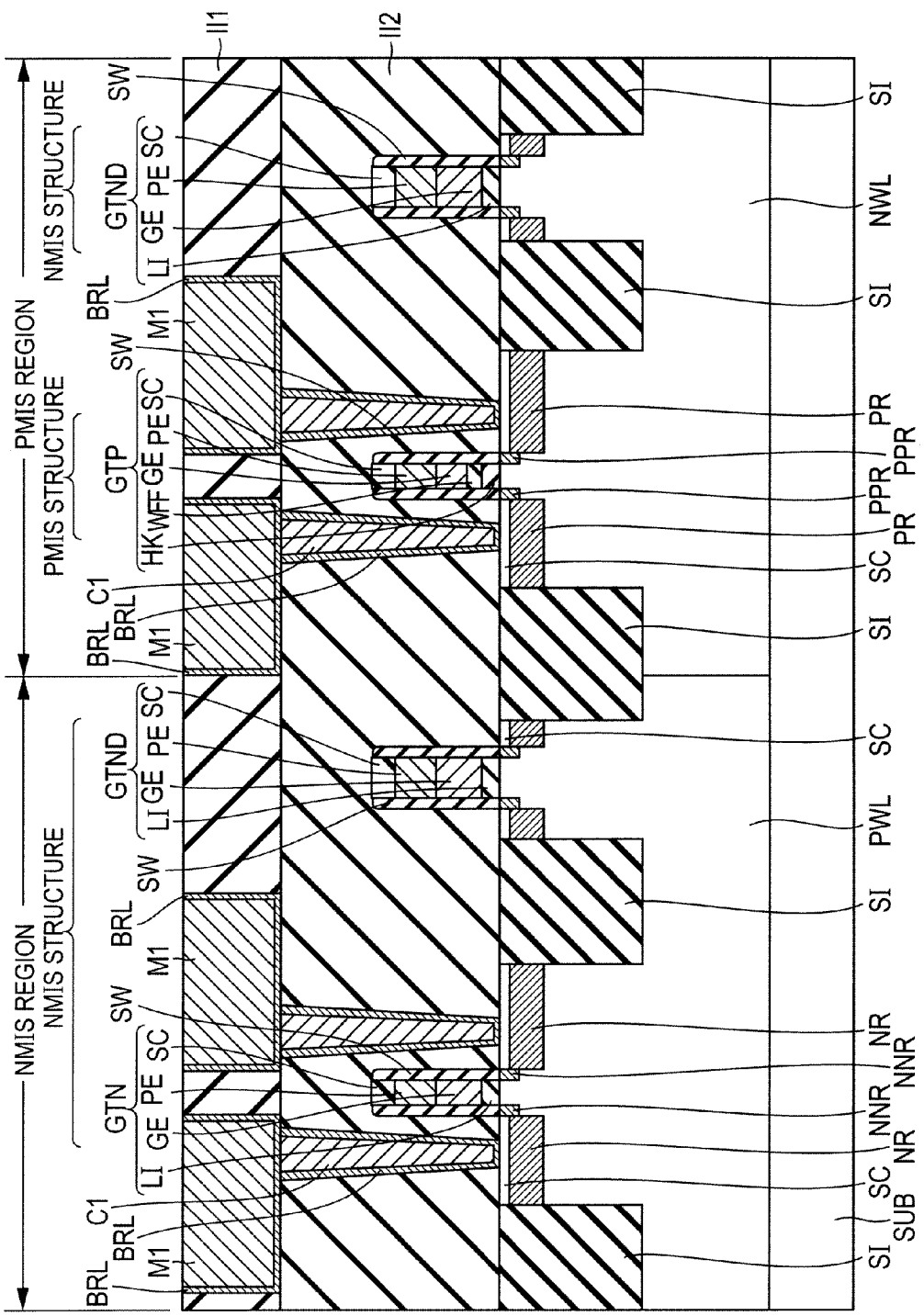
FIG. 15 is a sectional view showing the state after steps succeeding the step shown in FIG. 13 for forming the configuration shown in the sectional view of FIG. 3.

In reference to FIGS. 14 and 15, an n-type impurity NR (corresponding to the active regions ACN and ACND in FIG. 1) and a low-concentration n-type impurity NNR are formed around (on the right and left sides in the figures) the region where the gate insulation film LI is formed by an ordinary photolithographic technology and an ion implantation technology. Likewise, a p-type impurity PR (corresponding to the active regions ACP and ACPD in FIG. 1) and a low-concentration p-type impurity PPR are formed around (on the right and left sides in the figures) the region where the gate insulation film HK is formed.

Through the above steps, an NMIS structure and a PMIS structure of the functional transistors and the dummy transistors are formed. The NMIS structure is formed in the region where the resist pattern RS is removed in the step of FIGS. 4 and 5 and the PMIS structure is formed in the region where the resist pattern RS is not removed in the step of FIGS. 4 and 5.

Subsequently, a sidewall insulation film SW is formed for example comprising a silicon oxide film around (on the right and left sides in FIGS. 14 and 15 of) the respective gate electrodes for example by etch-back. Then a silicide layer SC is formed over the surface of the respective gate electrodes and impurities. The silicide layer SC is formed by forming a high-melting-point metal layer so as to cover the whole surface of the pattern, subsequently applying heat treatment, and thus reacting the high-melting-point metal with silicon.

Further successively, an interlayer insulation film II1 comprising a silicon oxide film is formed by a CVD (Chemical Vapor Deposition) method for example. Successively, the interlayer insulation film II1 is polished so that the upper surface may be flattened by a chemical mechanical polishing method called CMP (Chemical Mechanical Polishing). Then contact holes are formed in the interlayer insulation film II1 by an ordinary photolithographic technology and an etching technology. The side of the interior of each of the contact holes is covered with a barrier metal BRL for example comprising tantalum (Ta) and the interior of each of the contact holes is filled with an electrically conductive film C1 for example comprising tungsten (W).

Further, a metal wiring M1 for example comprising aluminum (Al) is formed by an ordinary photolithographic technology and an etching technology. The metal wiring M1 is formed so as to be electrically coupled to the n-type impurity NR and the p-type impurity PR through the contact C1.

Furthermore, an interlayer insulation film II2 is formed over the interlayer insulation film II1 and the metal wiring M1. Successively, a layer may be formed further thereover but the explanation is omitted here.

A step of deciding which is to be selected, the NMIS structure or the PMIS structure, particularly in each of the dummy MIS transistors is explained hereunder.

Figure 16:
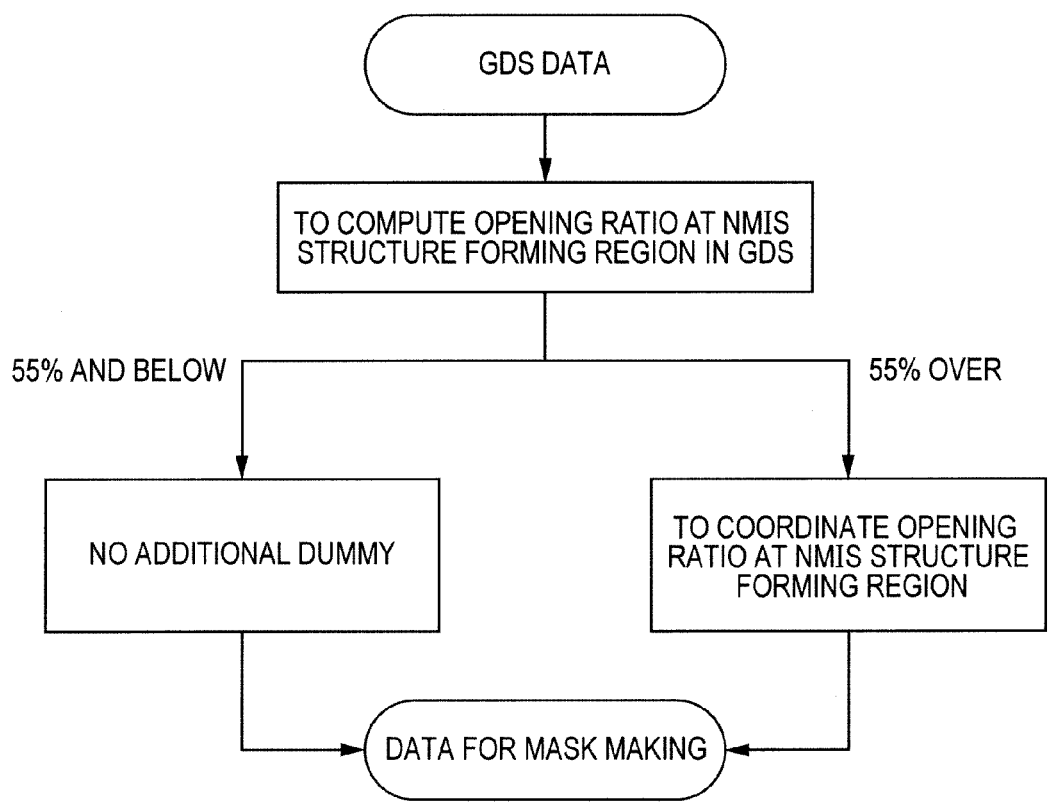
FIG. 16 is a flowchart showing steps for coordinating the area ratio of NMIS structure forming regions.

In reference to FIG. 16, in the step of FIGS. 4 and 5, the following steps are applied when the range of the NMIS structure forming regions NMR where the resist pattern RS opens is decided. Firstly, the ratio of the area (opening ratio) of the NMIS structure forming regions NMR in the transistor forming region (region analyzed by GDS) in a planar view is computed by GDS (Graphic Database System) data over the surface of an arbitrary transistor forming region analyzed for example by glow discharge optical emission spectroscopy. If the result shows 55% or less that is an intended value, a mask forming the resist pattern RS of FIGS. 4 and 5 is used as it is in the manufacturing step of the relevant transistor forming regions (that is, dummy NMIS transistors are not formed additionally).

Meanwhile, if the result is more than an intended value and exceeds 55%, adjustment is made so as to reduce the region where dummy NMIS transistors are formed.

More specifically, computation is made through the procedure described below. Here for example, it is supposed that the magnitude of the NMIS structure forming region NMR for forming the functional NMIS transistor in the NMIS region accounts for 20% of the whole transistor forming region and the magnitude of the PMIS structure forming region PMR for forming the functional PMIS transistor in the PMIS region accounts for 20% of the whole transistor forming region. Here, on this occasion, it is supposed that an intended ratio of the area of the NMIS structure forming regions NMR to the whole area is 50%.

In the above case, it is preferable that the region where the dummy transistors are formed accounts for 60% of the whole substrate and the dummy NIMS transistors account for a half of the region where the dummy transistors are formed, namely 30% of the whole substrate. This can be computed by obtaining the value of X in the expression "area ratio of NMR of functional NMIS transistor +area ratio of dummy/X=50%" as a coordinating ratio and here X=2 is obtained from the expression 20+60/X=50.

Consequently, the NMIS structure forming regions NMR are formed in the region where dummy transistors are formed so that a half of the whole region where dummy transistors are formed may be dummy NMIS transistors. Consequently as shown in FIG. 1, the dummy transistors aligned in a row in the vertical direction on the right sides of the functional transistors are allocated so that the dummy NMIS transistors and the dummy PMIS transistors may be aligned alternately (may be adjacent to each other). Further, the transistors linearly aligned under the functional transistors are allocated so that the dummy NMIS transistors and the dummy PMIS transistors may be formed alternately in respective rows. By coordinating the NMIS structure forming regions NMR and the PMIS structure forming regions PMR so as to be linearly aligned alternately one row by one row in this way, the step of applying coordinating so that about a half of all the dummy transistors may be dummy NMIS transistors is facilitated.

Practically here, whereas the dummy NMIS transistors formed under the functional transistors in FIG. 1 are aligned in two rows, the dummy PMIS transistors are aligned in a row. Consequently, more than a half of all the dummy transistors are NMIS transistors. As a whole however, the dummy NMIS transistors account for about a half of all the dummy transistors.

As stated above, the area of the n-type opening region is coordinated so that the ratio of the n-type opening region may account for 55% or less (or 50%) in the transistor forming region in a planar view. Here as stated above, the region exceeding 55% of the whole transistor forming region is the NMIS region. As a result, the PMIS structure forming regions PMR are formed at least at parts of the NMIS region so that the NMIS structure forming regions NMR and the PMIS structure forming regions PMR may coexist in the NMIS region.

Functions and effects of the present embodiment are explained hereunder in comparison with FIGS. 17 to 23 showing a comparative example of the present embodiment.

Figure 17:
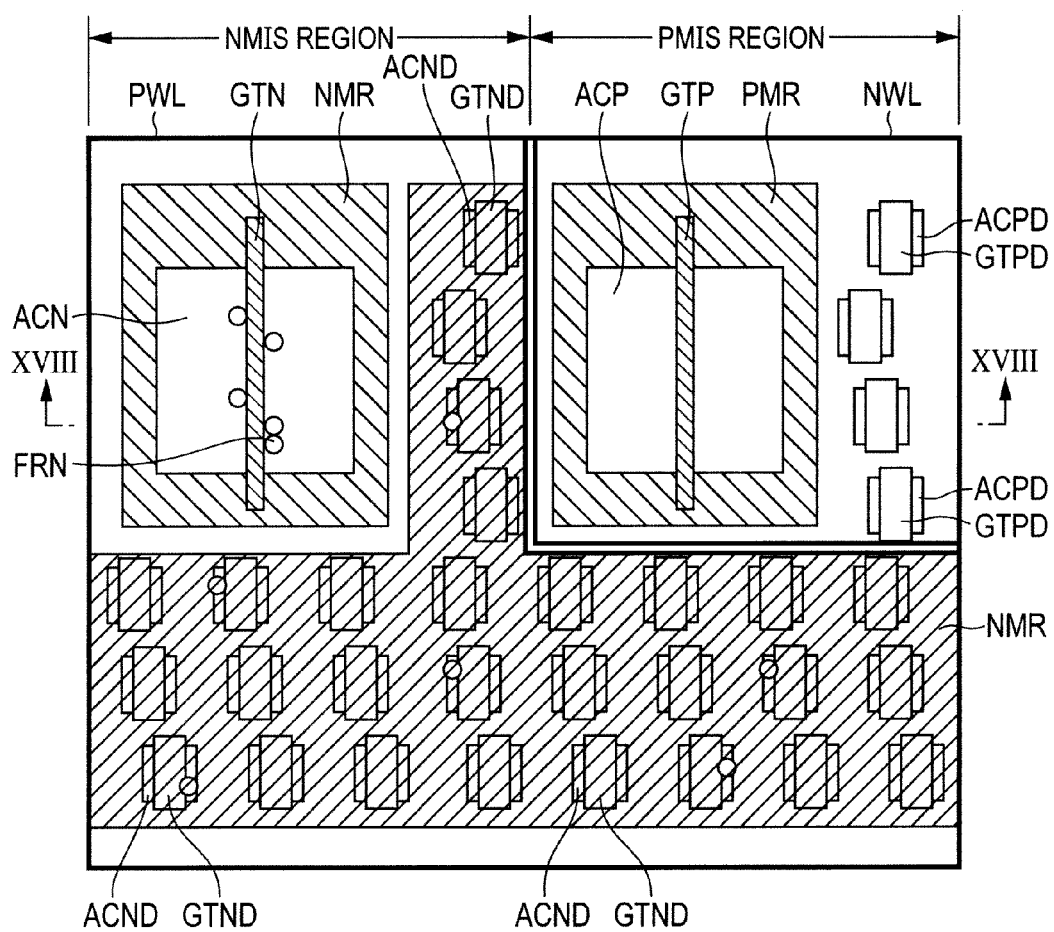
FIG. 17 is a schematic plan view showing alignment of functional transistors and dummy transistors at n-type and p-type well regions in a semiconductor device according to a comparative example.
Figure 18:
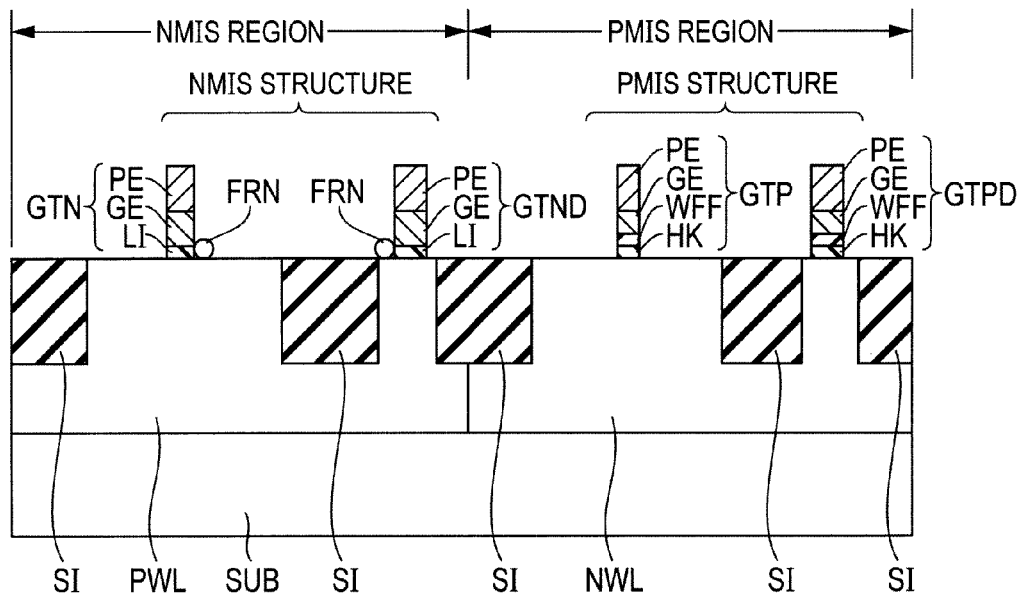
FIG. 18 is a sectional view taken on line XVIII-XVIII of FIG. 17 minutely showing the configuration of gate electrodes in particular.

In reference to FIGS. 17 and 18, in a semiconductor device according to a comparative example, an NMIS region and a PMIS region partitioned at the same area ratios as the present embodiment are formed. In the semiconductor device according to the comparative example too, a plurality of dummy transistors are allocated in the same way as the present embodiment. In the comparative example however, all of the functional transistor and dummy transistors in the NMIS region are a functional NMIS transistor and dummy NMIS transistors having an NMIS structure. In the comparative example further, all of the functional transistor and dummy transistors in the PMIS region are a functional PMIS transistor and dummy PMIS transistors having a PMIS structure.

In the comparative example therefore, for example in the case where the NMIS region accounts for 55% and over to 80% and below of the whole transistor forming region in area ratio, the area ratio of the NMIS structure forming regions NMR also exceeds 55% of the whole area.

In reference to FIGS. 19 to 23, the manufacturing method of the structure shown in FIGS. 17 and 18 is basically the same as the manufacturing method of the structure of the preset embodiment shown in FIGS. 4 to 13. The step of FIG. 19 corresponds to the step of FIGS. 4 and 5, the step of FIG. 20 to the step of FIGS. 6 and 7, the step of FIG. 21 to the step of FIGS. 8 and 9, the step of FIG. 22 to the step of FIGS. 10 and 11, and the step of FIG. 23 to the step of FIGS. 12 and 13. Here in FIGS. 19 to 23, a feature of forming a gate electrode GTN of the NMIS structure and a gate electrode GTP of the PMIS structure is shown in the figures regardless of whether it is functional or dummy.

Figure 19:
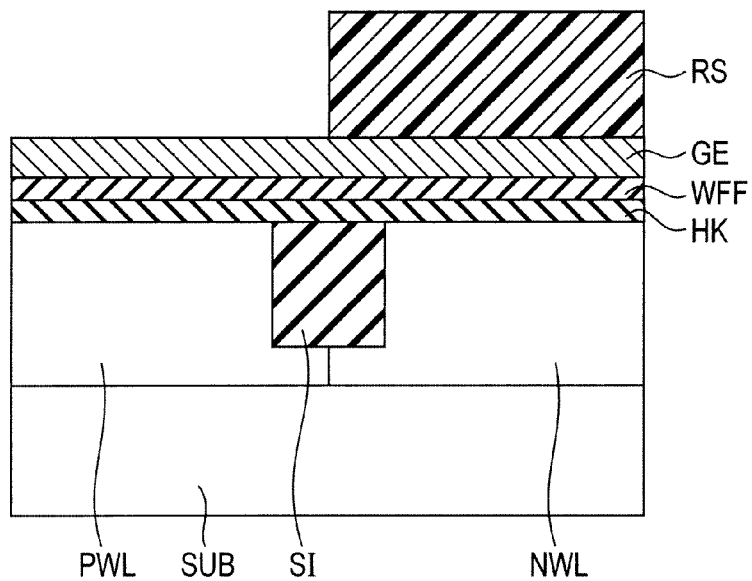
FIG. 19 is a sectional view showing a first step for forming the configuration shown in the sectional view of FIG. 18.
Figure 20:
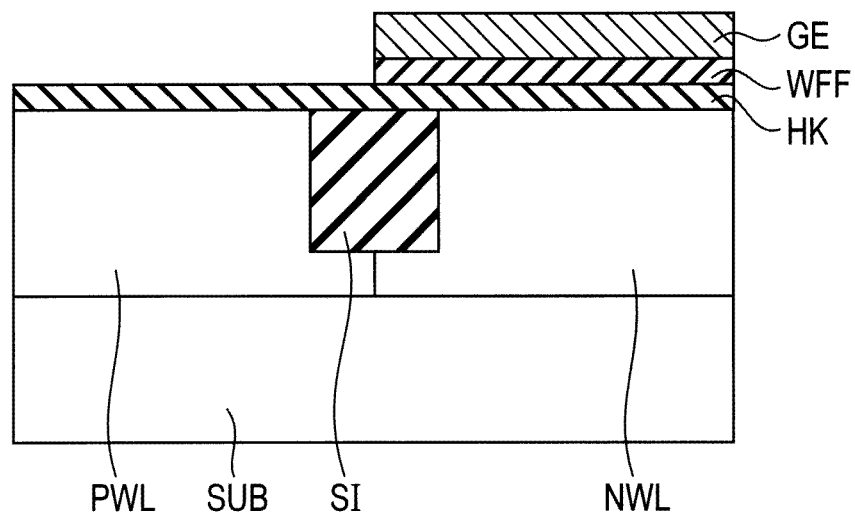
FIG. 20 is a sectional view showing a second step for forming the configuration shown in the sectional view of FIG. 18.
Figure 21:
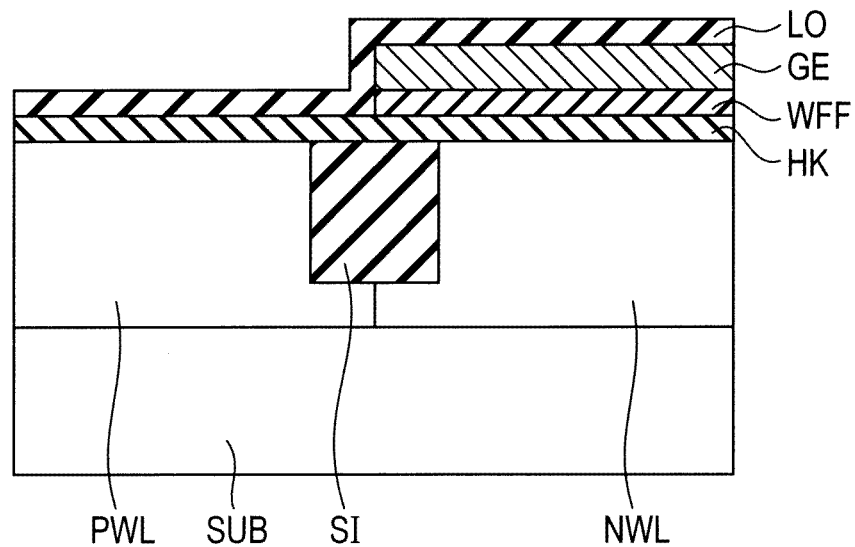
FIG. 21 is a sectional view showing a third step for forming the configuration shown in the sectional view of FIG. 18.
Figure 22:
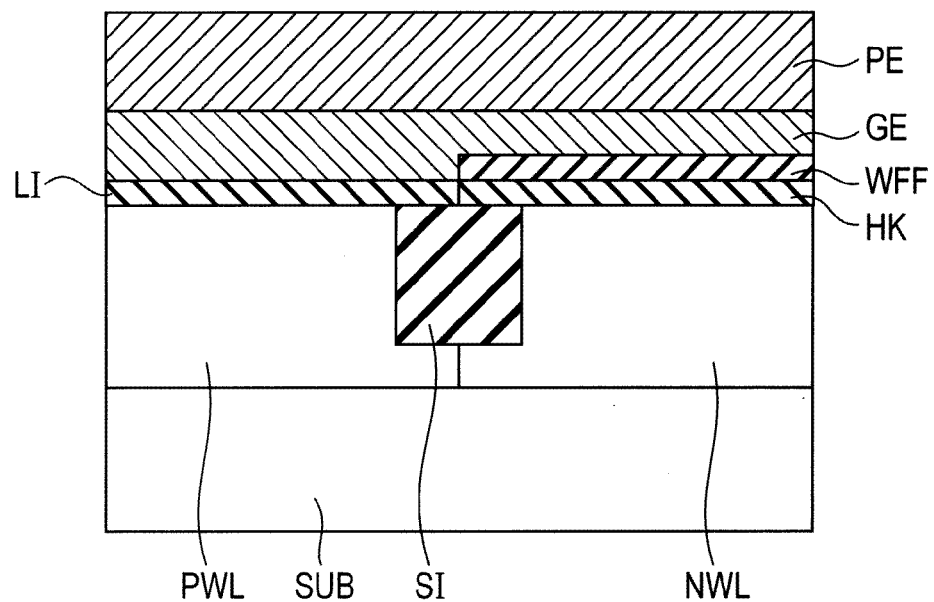
FIG. 22 is a sectional view showing a fourth step for forming the configuration shown in the sectional view of FIG. 18.

As shown in FIG. 19, in the comparative example, a resist pattern RS opens over the whole NMIS region and the resist pattern RS does not open at all in the PMIS region.

Figure 23:
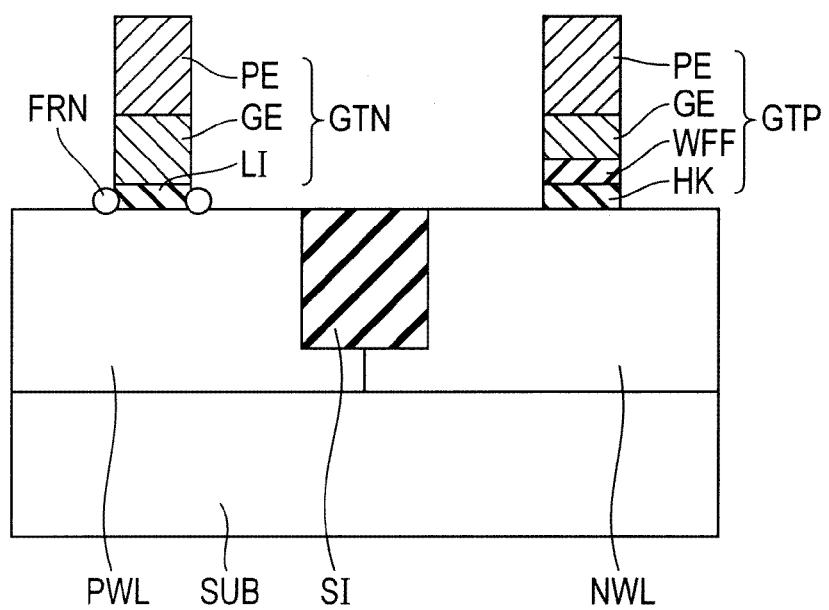
FIG. 23 is a sectional view showing a fifth step for forming the configuration shown in the sectional view of FIG. 18.

In the case where the area ratio of the NMIS structure forming regions NMR is as high as over 55% to the whole transistor forming region and a lanthanum insulation film LI of a high electric permittivity is used like the comparative example, it sometimes happens that a foreign matter FRN may adhere onto the side of the lanthanum insulation film LI acting as a gate insulation film when the gate electrode GTN is patterned as shown in FIG. 23. The foreign matter is formed by reacting an etching gas containing fluorine (F) used when the gate electrode is patterned with the lanthanum insulation film LI. The foreign matter comprises lanthanum fluoride.

Meanwhile, when the area ratio of the NMIS structure forming regions NMR to the whole transistor forming region is reduced to about 50% (55% and below) like the present embodiment, the ratio of formed dummy NMIS transistors decreases. The present inventors have earnestly studied and resultantly found that the possibility of generating a foreign matter FRN can be reduced by reducing the ratio of the formed transistors having the NMIS structure, namely having the lanthanum insulation film LI. Consequently, by forming some of the dummy transistors into the PMIS structure even in the NMIS region like the present embodiment, it is possible to inhibit a foreign matter FRN from being generated even when a lanthanum insulation film LI of a high electric permittivity is used as the gate insulation film of the NMIS structure like the present embodiment.

If a foreign matter FRN is generated, there is a possibility for example that a gate electrode and a contact hole of a functional transistor may short-circuit through the foreign matter FRN. Consequently, if a foreign matter FRN can be inhibited from being generated in the present embodiment, it is possible to avert such short-circuit and hence inhibit the yield of a transistor from lowering by the foreign matter FRN.

Then in the NMIS structure, the gate insulation film LI of a high electric permittivity acting as an n-type insulation film may comprise an insulation material ($MgO_2$ or $Y_2O_3$) containing, besides lanthanum, magnesium (Mg) or yttrium (Y). Even in the case of forming an insulation material containing magnesium or yttrium, there is a possibility that a foreign matter may adhere onto the side of the gate insulation film LI.

Meanwhile, after various gate electrodes are formed, the whole semiconductor substrate SUB is cleaned before sent to the succeeding step. Even when the retention time of the semiconductor substrate SUB after the gate electrodes are formed and before they are subjected to a cleaning step is long, a foreign matter FRN is inhibited from adhering onto the lanthanum insulation film LI. Consequently, in the present embodiment, it is possible for example to make the retention time longer than the comparative example and resultantly stabilize the quality of a formed semiconductor device.

Meanwhile, the area ratio of the NMIS structure forming regions is coordinated with dummy transistors. The dummy transistors here are formed for enhancing flatness when interlayer insulation films and the like over transistors are flattened by CMP. Consequently, the dummy transistors do not necessarily work as actual transistors. Consequently, even when dummy PMIS transistors are formed in the p-type well region PWL in the NMIS region, the function of the semiconductor device has no problem.

(Embodiment 2)

The present embodiment is different from Embodiment 1 in the alignment of plural dummy transistors and NMIS structure forming regions NMR. The configurations of semiconductor devices according to the present embodiment are hereunder explained in reference to FIGS. 24 to 27.

In reference to FIGS. 24 to 27, in any of the semiconductor devices in the examples according to the present embodiment, an NMIS region and a PMIS region which are partitioned at area ratios similar to Embodiment 1 are formed. Then both an NMIS structure and a PMIS structure coexist at least in the dummy transistors in the NMIS region.

Figure 24:
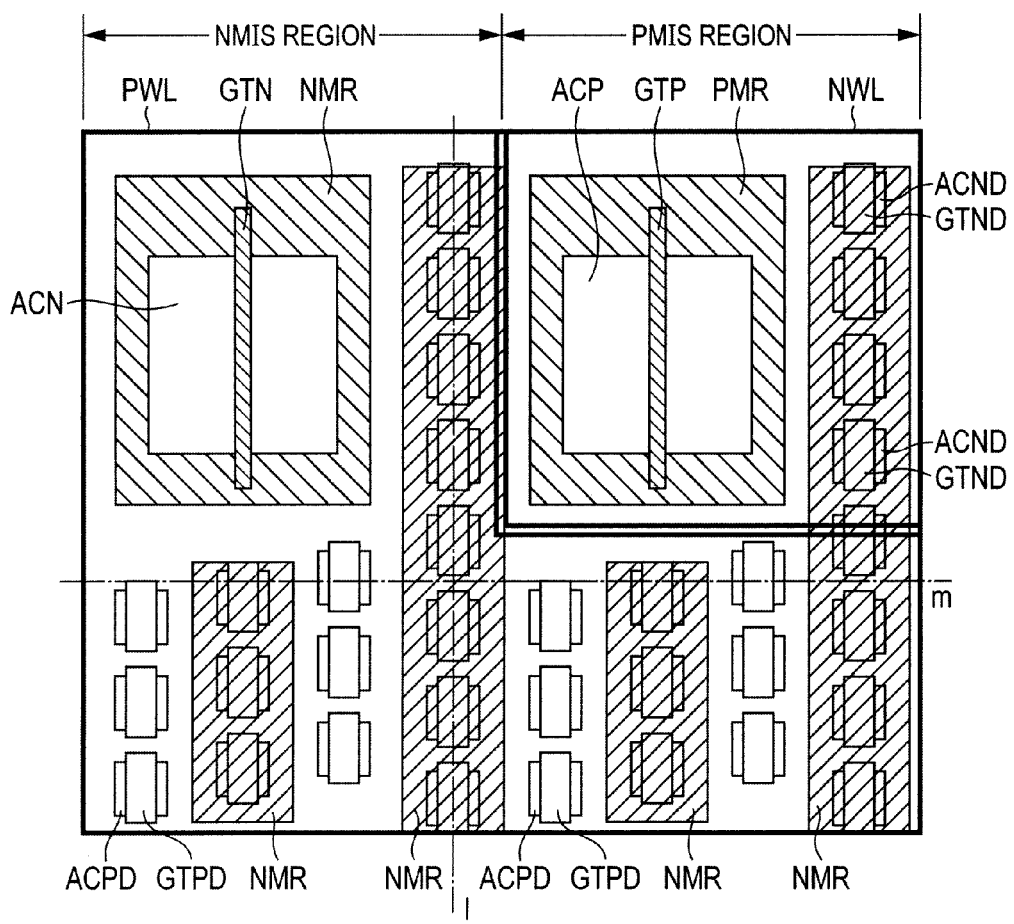
FIG. 24 is a schematic plan view showing alignment of functional transistors and dummy transistors at n-type and p-type well regions in a semiconductor device according to the first example of Embodiment 2 of the present invention.

In the present embodiment however, in both the NMIS region and the PMIS region, in the vertical direction in FIGS. 24 to 27, the plural dummy transistors are allocated so that the gate electrodes GTND and GTPD may align respectively on a virtual straight line l (refer to FIG. 24). In the horizontal direction in FIGS. 24 to 27 in contrast, the dummy transistors are allocated so that the gate electrodes may not be aligned linearly on a virtual straight line m (refer to FIG. 24) but may positionally deviate from each other along the straight line m.

In the present embodiment of allocating dummy transistors as stated above, for example the case where the magnitude of the NMIS structure forming region of a functional NMIS transistor accounts for 20% of the whole transistor forming region and the magnitude of the PMIS structure forming region of a functional PMIS transistor accounts for 20% of the whole transistor forming region is supposed. On this occasion, it is supposed that an intended area ratio of the NMIS structure forming regions NMR to the whole is 50%.

In the above case, it is preferable that the region where the dummy transistors are formed accounts for 60% of the whole substrate and the dummy NMIS transistors account for a half of the region where the dummy transistors are formed, namely 30% of the whole substrate. This can be computed by obtaining the value of X in the expression "area ratio of NMR of functional NMIS transistor+area ratio of dummy/X=50%" as a coordinating ratio and here X=2 is obtained from the expression 20+60/X=50.

In the above case therefore, it is preferable that the rows of the linearly aligned dummy NMIS transistors and the rows of the linearly aligned dummy PMIS transistors are arranged alternately as shown in the first example of FIG. 24. By so doing, the rows of the linear dummy NMIS structure forming regions NMR and the rows of the linear dummy PMIS structure forming regions PMR are formed alternately so that the dummy NMIS transistors may account for a half of the whole region where the dummy transistors are formed.

Successively, for example the case where the magnitude of the NMIS structure forming region of a functional NMIS transistor accounts for 30% of the whole transistor forming region and the magnitude of the PMIS structure forming region of a functional PMIS transistor accounts for 10% of the whole transistor forming region is supposed. On this occasion, it is supposed that an intended area ratio of the NMIS structure forming regions NMR to the whole is 50%.

In the above case, it is preferable that the region where the dummy transistors are formed accounts for 60% of the whole substrate and the dummy NMIS transistors account for one third of the region where the dummy transistors are formed, namely 20% of the whole substrate. This can be computed by obtaining the value of X in the expression "area ratio of NMR of functional NMIS transistor+area ratio of dummy/X=50%" as a coordinating ratio and here X=3 is obtained from the expression 30+60/X=50.

Figure 25:
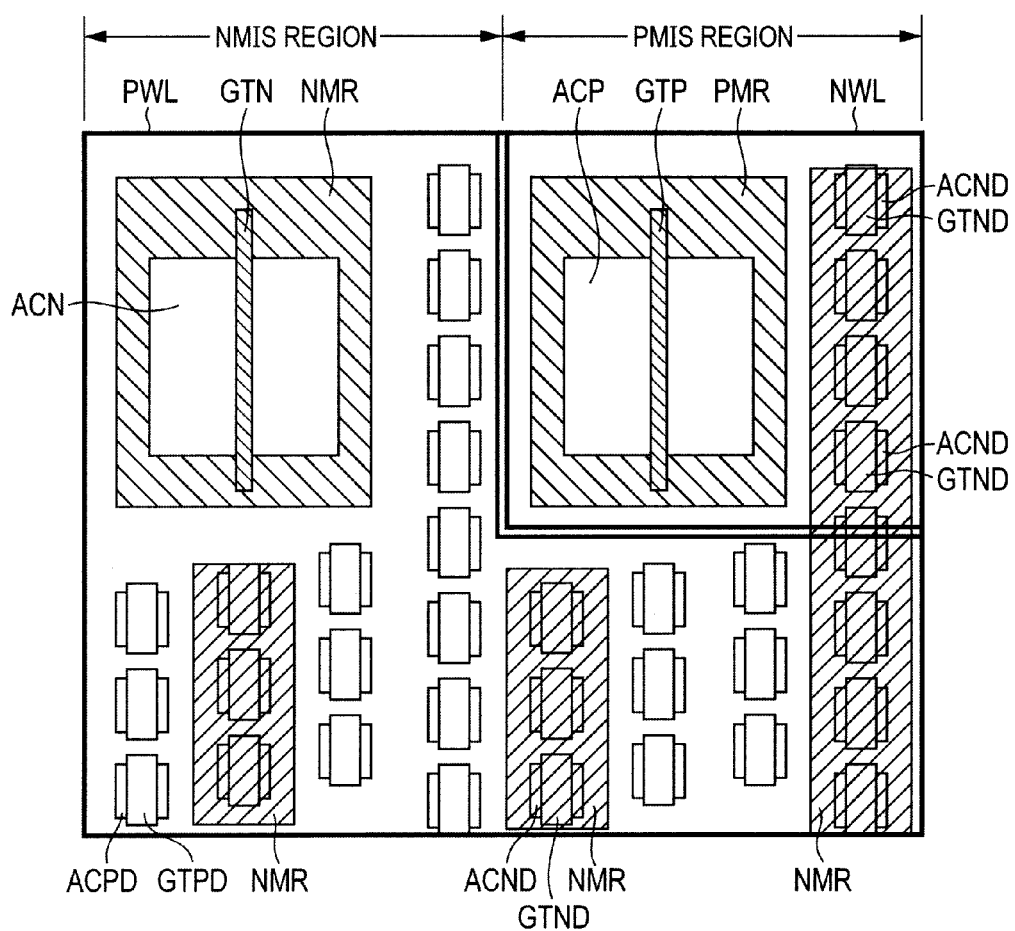
FIG. 25 is a schematic plan view showing alignment of functional transistors and dummy transistors at n-type and p-type well regions in a semiconductor device according to the second example of Embodiment 2 of the present invention.
Figure 26:
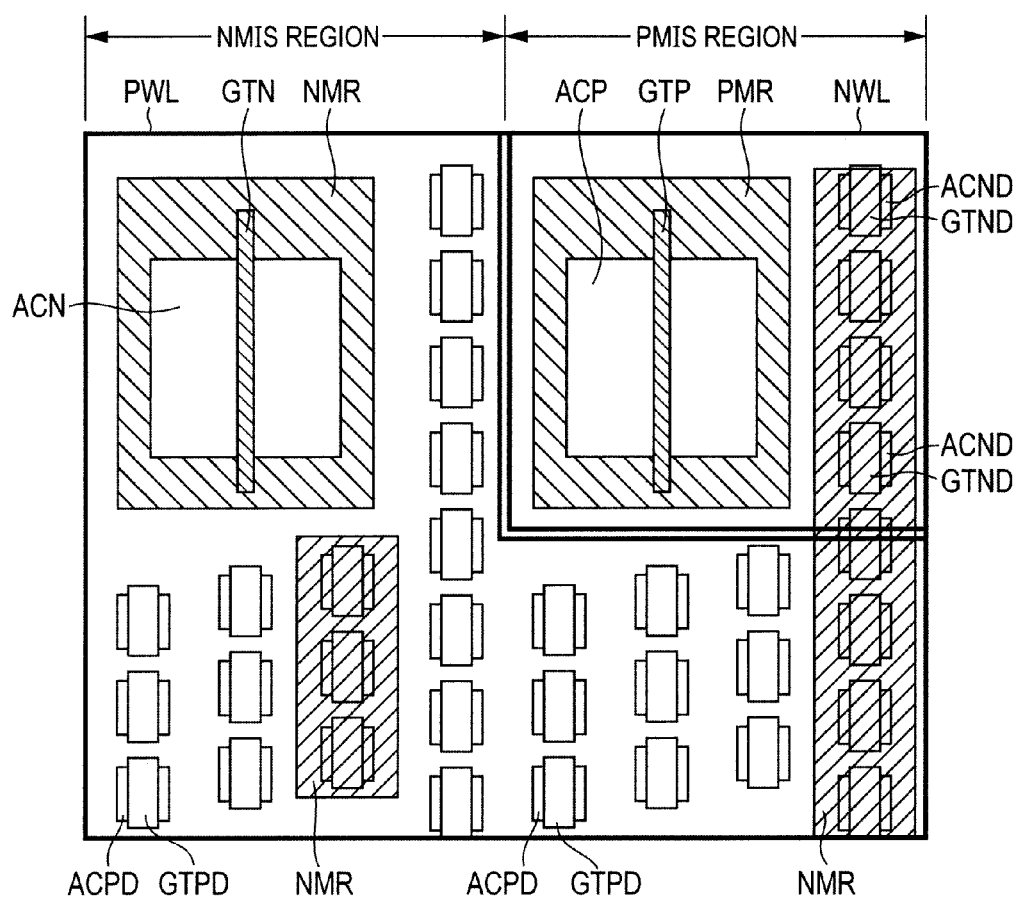
FIG. 26 is a schematic plan view showing alignment of functional transistors and dummy transistors at n-type and p-type well regions in a semiconductor device according to the third example of Embodiment 2 of the present invention.
Figure 27:
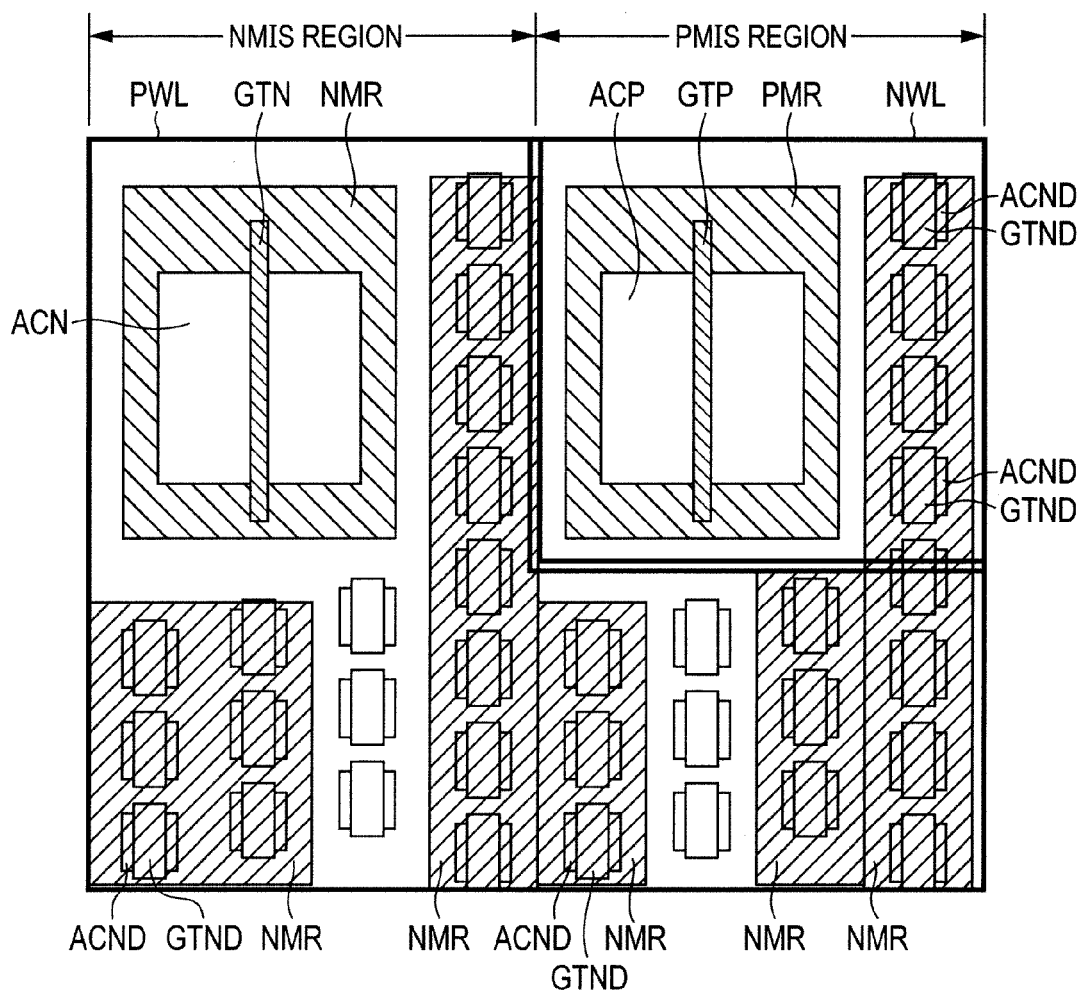
FIG. 27 is a schematic plan view showing alignment of functional transistors and dummy transistors at n-type and p-type well regions in a semiconductor device according to the fourth example of Embodiment 2 of the present invention.

In the above case therefore, it is preferable that the dummy NMIS transistors and the dummy PMIS transistors are linearly aligned respectively so that the ratio may be roughly one to two as shown in the second example of FIG. 25. By so doing, the dummy NMIS structure forming regions NMR and the dummy PMIS structure forming regions PMR are formed linearly so that the dummy NMIS transistors may account for one third of the whole region where the dummy transistors are formed.

Successively, for example the case where the magnitude of the NMIS structure forming region of a functional NMIS transistor accounts for 40% of the whole transistor forming region and the magnitude of the PMIS structure forming region of a functional PMIS transistor accounts for 10% of the whole transistor forming region is supposed. On this occasion, it is supposed that an intended area ratio of the NMIS structure forming regions NMR to the whole is 50%.

If this case is considered in the same way as the above case, the coordinating ratio X is obtained as X=5 from the expression 40+50/X=50. In this case therefore, it is preferable that the dummy NMIS transistors and the dummy PMIS transistors are linearly aligned respectively so that the ratio may be roughly one to four as shown in the third example of FIG. 26. By so doing, the dummy NMIS transistors account for one fifth of the whole region where the dummy transistors are formed.

Successively, for example the case where the magnitude of the NMIS structure forming region of a functional NMIS transistor accounts for 10% of the whole transistor forming region and the magnitude of the PMIS structure forming region of a functional PMIS transistor accounts for 30% of the whole transistor forming region is supposed. On this occasion, it is supposed that an intended area ratio of the NMIS structure forming regions NMR to the whole is 50%.

If this case is considered in the same way as the above case, the coordinating ratio X is obtained as X=1.5 from the expression 10+60/X=50. In this case therefore, it is preferable that the dummy NMIS transistors and the dummy PMIS transistors are linearly aligned respectively so that the ratio may be roughly two to one as shown in the fourth example of FIG. 27. By so doing, the dummy NMIS transistors account for two third of the whole region where the dummy transistors are formed.

Here in FIGS. 24 to 27 too in the same way as FIG. 1, to be precise, there is some difference from an intended area ratio but the dummy NMIS transistors and the dummy PMIS transistors are allocated so that nearly an intended area ratio may be obtained.

Since the semiconductor devices in FIGS. 24 to 27 are nearly identical to the semiconductor devices according to Embodiment 1 except the above matters, the elements in FIGS. 24 to 27 identical to those in Embodiment 1 are represented by the same symbols and the explanations are not repeated.

The present embodiment having such a configuration as stated above exhibits functions and effects similar to Embodiment 1. More specifically, in the present embodiment too, in the NMIS region in particular, dummy NMIS transistors and dummy PMIS transistors coexist as dummy transistors in the same way as Embodiment 1. Consequently, the proportion of the transistors where the NMIS structure is formed reduces for example in comparison with the case where all the dummy transistors in the NMIS region have the NMIS structure. As a result, in the same way as Embodiment 1, it is possible to reduce the possibility that a foreign matter adheres to the side of a lanthanum insulation film LI in the case where a gate insulation film of the NMIS structure comprises the lanthanum insulation film of a high electric permittivity.

By deciding the allocation of the NIMS structure forming regions NMR and the PIMS structure forming regions PMR of dummy transistors for each of the rows of the dummy transistors by the above computation method, it is possible to form a configuration that easily reduces the possibility of the adhesion of a foreign matter.

Embodiment 2 according to the present invention is different from Embodiment 1 according to the present invention only in the above stated points. That is, the configuration, the conditions, the procedures, the effects, etc. of Embodiment 2 according to the present invention which have not been described above are all equivalent to those of Embodiment 1 according to the present invention.

(Embodiment 3)

The present embodiment is different from Embodiment 1 in the alignment of plural dummy transistors and NMIS structure forming regions NMR. The configurations of semiconductor devices according to the present embodiment are hereunder explained in reference to FIGS. 28 and 29.

Figure 28:
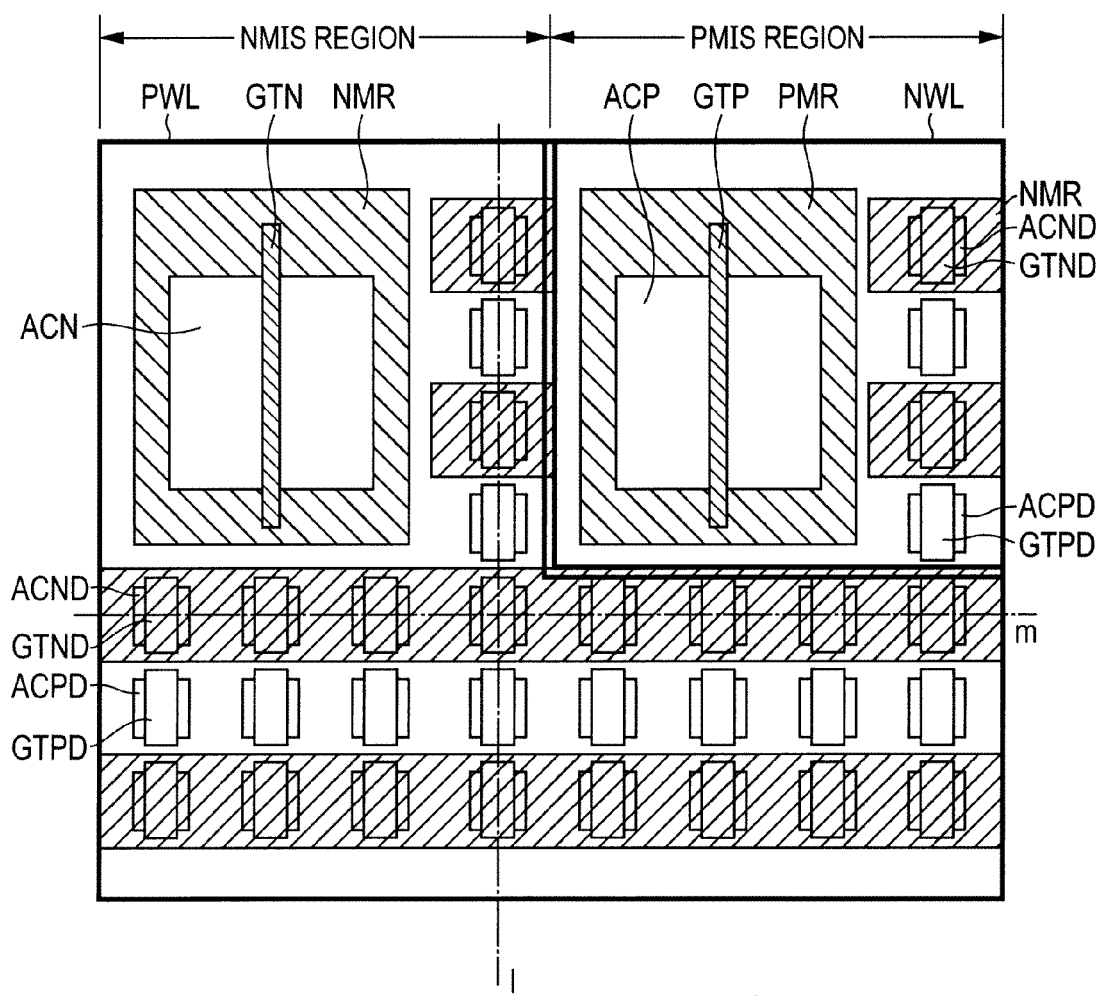
FIG. 28 is a schematic plan view showing alignment of functional transistors and dummy transistors at n-type and p-type well regions in a semiconductor device according to the first example of Embodiment 3 of the present invention.
Figure 29:
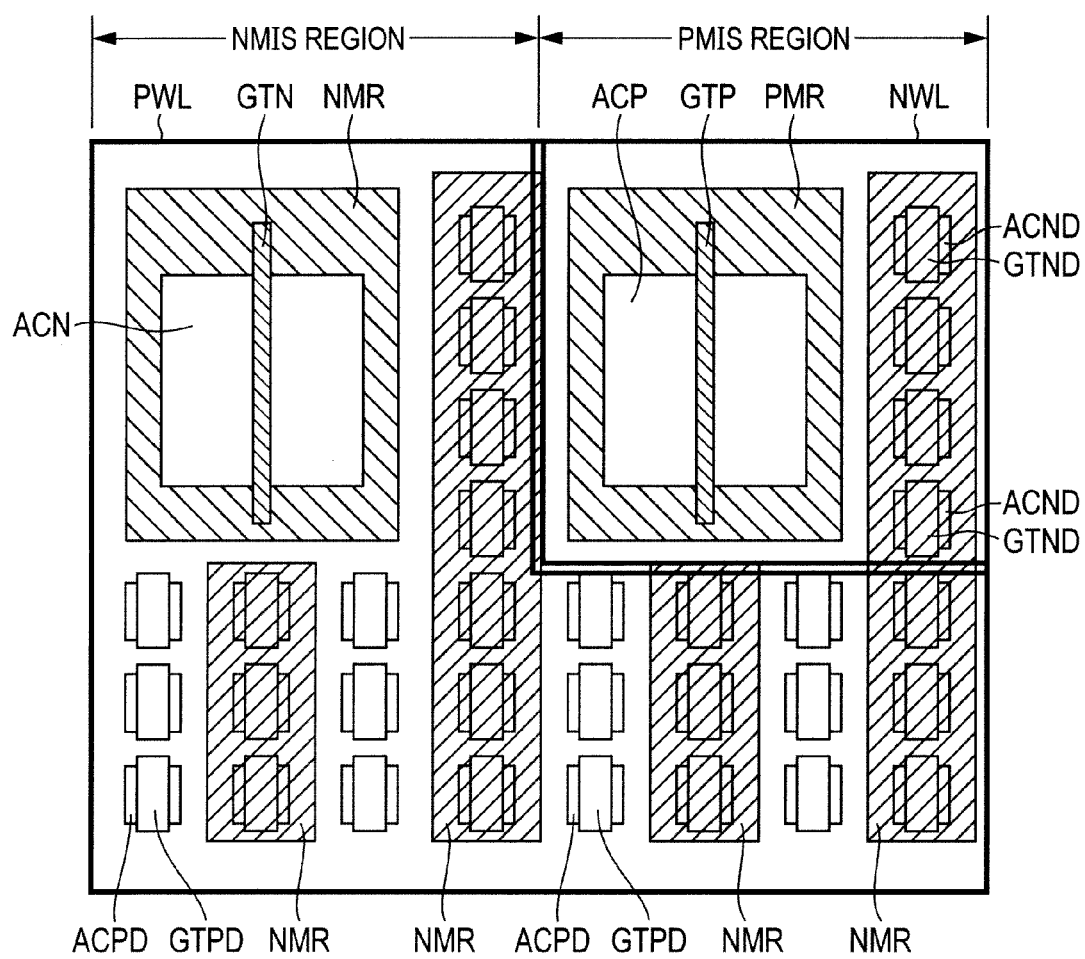
FIG. 29 is a schematic plan view showing alignment of functional transistors and dummy transistors at n-type and p-type well regions in a semiconductor device according to the second example of Embodiment 3 of the present invention.

In reference to FIGS. 28 and 29, in any of the semiconductor devices in the examples according to the present embodiment, an NMIS region and a PMIS region which are partitioned at area ratios similar to Embodiment 1 are formed. Then both an NMIS structure and a PMIS structure coexist at least in the dummy transistors in the NMIS region.

In the present embodiment however, in both the NMIS region and the PMIS region, in the vertical direction in FIGS. 28 and 29, the plural dummy transistors are allocated so that the gate electrodes GTND and GTPD may align on a virtual straight line l (refer to FIG. 28). In the horizontal direction in FIGS. 28 and 29 further, the dummy transistors are allocated linearly so that all the gate electrodes GTND and GTPD may align on a virtual straight line m likewise (refer to FIG. 28).

The straight lines l and m are nearly perpendicular to each other. Consequently, in the present embodiment, the straight lines coupling the arrangements of the dummy transistors are nearly perpendicular to each other.

In the present embodiment of allocating dummy transistors as stated above, for example the case where the magnitude of the NMIS structure forming region of a functional NMIS transistor accounts for 20% of the whole transistor forming region and the magnitude of the PMIS structure forming region of a functional PMIS transistor accounts for 20% of the whole transistor forming region is supposed. On this occasion, it is supposed that an intended area ratio of the NMIS structure forming regions NMR to the whole is 50%.

If this case is considered in the same way as the above embodiment, the coordinating ratio X is obtained as X=2 from the expression 20+60/X=50. Consequently, it is preferable that the dummy NMIS transistors account for about a half of all the dummy transistors. That is, it is preferable for example that the dummy NMIS transistors and the dummy PMIS transistors are linearly aligned in every other row.

On this occasion, as shown in the first example of FIG. 28 for example, the NMIS structure forming regions NMR and the PNIS structure forming regions PMR may be formed so as to linearly extend in the horizontal direction in FIG. 28 respectively. Otherwise, as shown in the second example of FIG. 29, the NMIS structure forming regions NMR and the PNIS structure forming regions PMR may be formed so as to linearly extend in the vertical direction in FIG. 29 respectively.

Since the semiconductor devices in FIGS. 28 and 29 are nearly identical to the semiconductor devices according to Embodiment 1 except the above matters, the elements in FIGS. 28 and 29 identical to those in Embodiment 1 are represented by the same symbols and the explanations are not repeated.

The present embodiment having such a configuration as stated above also exhibits functions and effects similar to Embodiment 1. Further, by arranging dummy transistors along both the straight line l and the straight line m perpendicular to the straight line l, the step of forming the NMIS structure forming regions NMR and the PNIS structure forming regions PMR linearly is further facilitated. Otherwise it is also possible to select the NMIS structure forming regions NMR and the PNIS structure forming regions PMR so as to extend in the direction of either the straight line l or the straight line m of FIG. 28. Consequently, by arranging dummy transistors along both the straight line l and the straight line m like the present embodiment, it is possible to increase the flexibility of forming the NMIS structure forming regions NMR.

Embodiment 3 according to the present invention is different from Embodiment 1 according to the present invention only in the above stated points. That is, the configuration, the conditions, the procedures, the effects, etc. of Embodiment 3 according to the present invention which have not been described above are all equivalent to those of Embodiment 1 according to the present invention.

(Embodiment 4)

The present embodiment is different from Embodiment 1 in the alignment of plural dummy transistors and NMIS structure forming regions NMR. The configurations of semiconductor devices according to the present embodiment are hereunder explained in reference to FIGS. 30 and 31.

Figure 30:
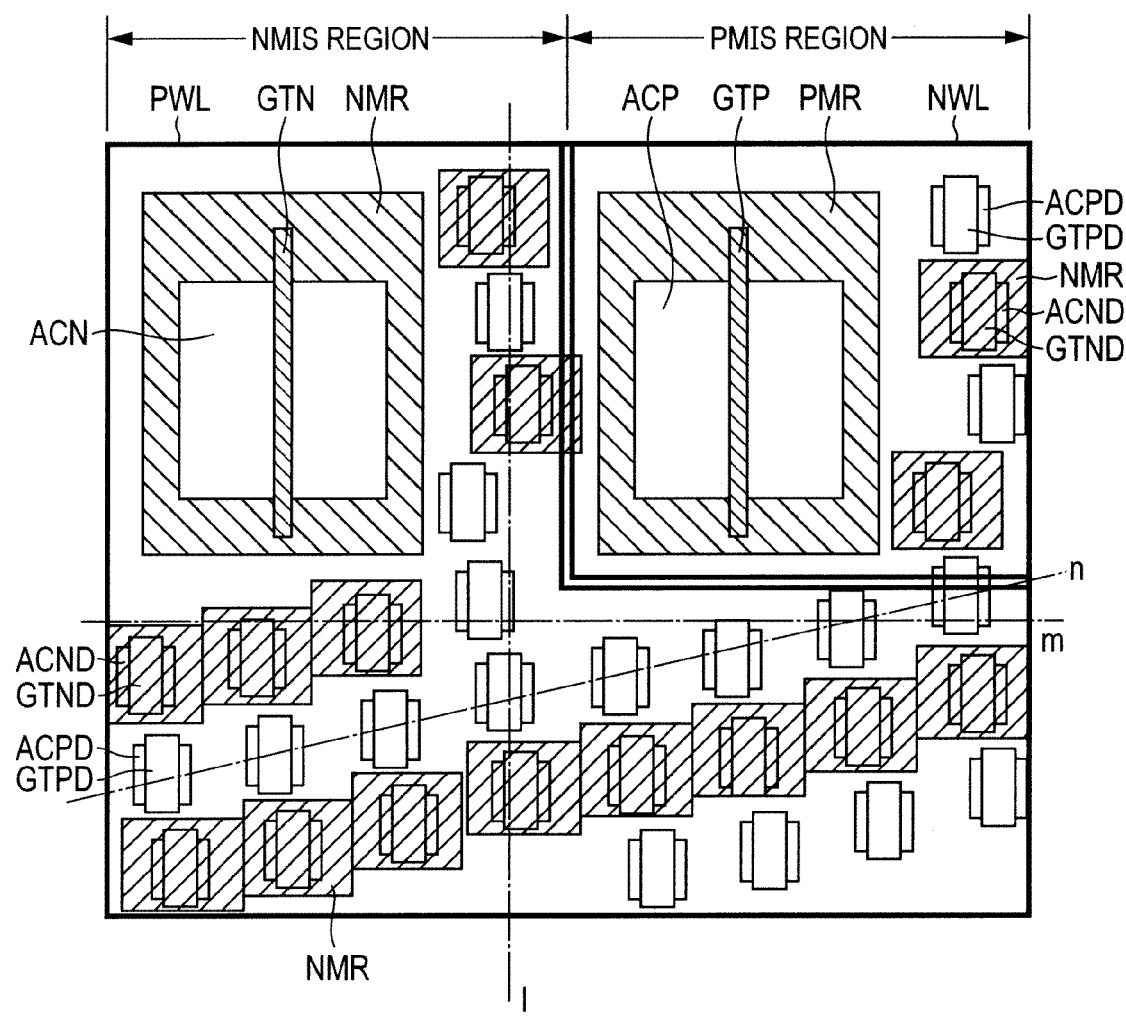
FIG. 30 is a schematic plan view showing alignment of functional transistors and dummy transistors at n-type and p-type well regions in a semiconductor device according to the first example of Embodiment 4 of the present invention.
Figure 31:
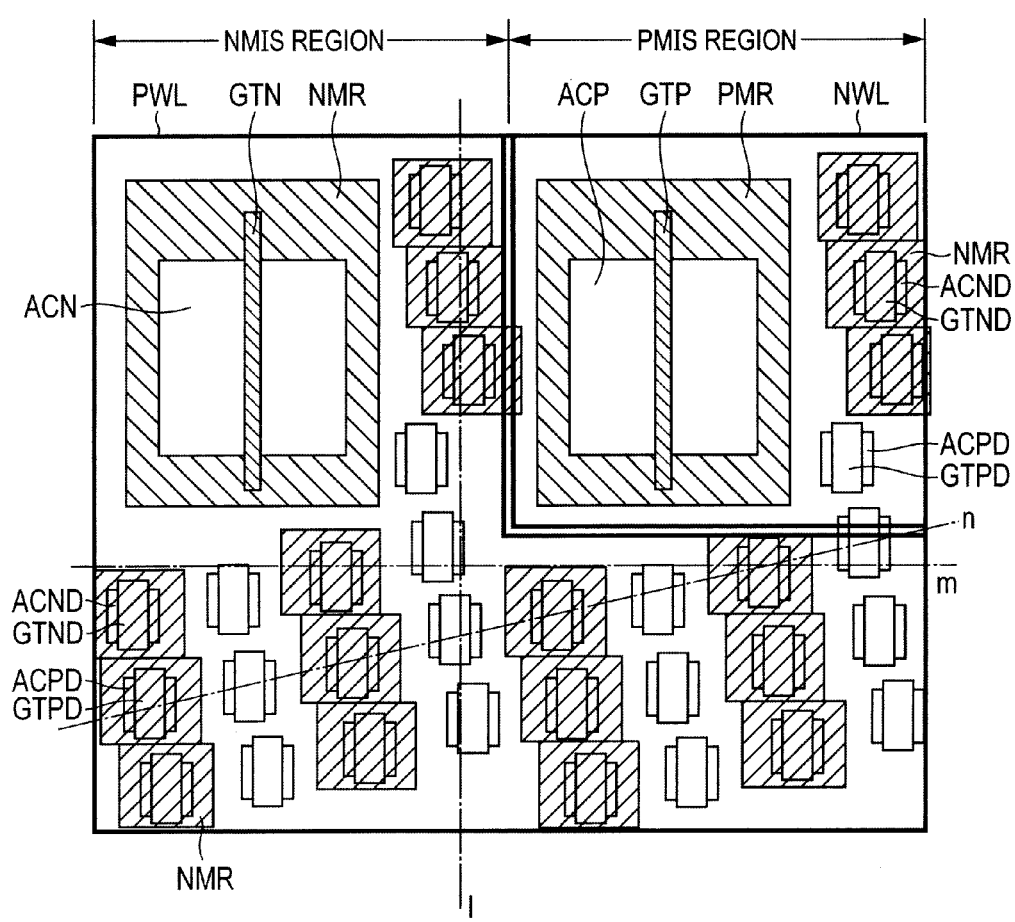
FIG. 31 is a schematic plan view showing alignment of functional transistors and dummy transistors at n-type and p-type well regions in a semiconductor device according to the second example of Embodiment 4 of the present invention.

In reference to FIGS. 30 and 31, in any of the semiconductor devices in the examples according to the present embodiment, an NMIS region and a PMIS region which are partitioned at area ratios similar to Embodiment 1 are formed. Then both an NMIS structure and a PMIS structure coexist at least in the dummy transistors in the NMIS region.

In the present embodiment however, in both the NMIS region and the PMIS region, the plural dummy transistors are not aligned linearly along the straight lines l and m in both the vertical and horizontal directions in FIGS. 30 and 31, but arranged so as to positionally deviate from each other along the straight lines. The dummy transistors aligned on the lower side of the functional transistors in particular are aligned nearly along the straight line n intersecting the straight lines l and m at acute angles.

In the present embodiment of allocating dummy transistors as stated above, for example the case where the magnitude of the NMIS structure forming region of a functional NMIS transistor accounts for 20% of the whole transistor forming region and the magnitude of the PMIS structure forming region of a functional PMIS transistor accounts for 20% of the whole transistor forming region is supposed. On this occasion, it is supposed that an intended area ratio of the NMIS structure forming regions NMR to the whole is 50%.

If this case is considered in the same way as the above embodiment, the coordinating ratio X is obtained as X=2 from the expression 20+60/X=50. Consequently, it is preferable that the dummy NMIS transistors account for about a half of all the dummy transistors. That is, it is preferable for example that the dummy NMIS transistors and the dummy PMIS transistors are linearly aligned every other row.

Consequently, when attention is focused on the rows of the dummy transistors arranged extendedly along the straight line n in the manner of being spaced from each other, the rows are formed so that the rows of the dummy NMIS transistors (NMIS structure forming regions NMR) and the rows of the dummy PMIS transistors (PMIS structure forming regions PMR) may be arranged alternately. Consequently as a whole, the proportion of the dummy NMIS transistors to the dummy transistors is about a half.

Since the semiconductor devices in FIGS. 30 and 31 are nearly identical to the semiconductor devices according to Embodiment 1 except the above matters, the elements in FIGS. 30 and 31 identical to those in Embodiment 1 are represented by the same symbols and the explanations are not repeated.

The present embodiment having such a configuration as stated above also exhibits functions and effects similar to Embodiment 1. Further, since the dummy transistors are aligned along a straight line extending in a direction oblique to the directions where the straight lines l and m extend, it is possible to arrange the dummy transistors so as to have a higher densely. That is, it is possible to further narrow a space between adjacent dummy transistors. Consequently, it is possible to further improve the flatness of an interlayer insulation film and the like formed over the dummy transistors.

Embodiment 4 according to the present invention is different from Embodiment 1 according to the present invention only in the above stated points. That is, the configuration, the conditions, the procedures, the effects, etc. of Embodiment 4 according to the present invention which have not been described above are all equivalent to those of Embodiment 1 according to the present invention.

It should be understood that the embodiments disclosed here are examples in every aspect and are not restrictive. It is intended that the scope of the present invention is shown not in the above explanations but in the section "WHAT IS CLAIMED IS" and includes all the modifications in the meaning equivalent to and within the range of "WHAT IS CLAIMED IS".

The present invention can be applied particularly advantageously to a semiconductor device having a functional NMIS transistor and dummy patterns thereof including a gate insulation film of a high electric permittivity and the manufacturing method thereof.

What is claimed is:

1. A semiconductor device comprising
   a semiconductor substrate having a main surface;
   a transistor forming region being formed over said main surface and having an n-type impurity region and a p-type impurity region;
   a functional n-channel transistor disposed in said p-type impurity region;
   a functional p-channel transistor disposed in said n-type impurity region;
   a plurality of first peripheral dummy transistors arranged at the periphery of said functional n-channel transistor in said p-type impurity region in a planar view; and
   a plurality of second peripheral dummy transistors arranged at the periphery of said functional p-channel transistor in said n-type impurity region in a planar view,
   wherein at least said plural first peripheral dummy transistors are arranged so that a peripheral n-type dummy gate structure and a peripheral p-type dummy gate structure coexist.

2. A semiconductor device according to claim 1,
   wherein said functional n-channel dummy transistor and said peripheral n-type gate structure include lanthanum as an n-type insulation film, and
   wherein said functional p-channel dummy transistor and said peripheral p-type gate structure include an aluminum oxide film as a p-type insulation film.

3. A semiconductor device according to claim 1, wherein said plural first and second peripheral dummy transistors are arranged in interiors of an n-type opening region and a p-type forming region formed linearly so as to be aligned in rows in view.

4. A semiconductor device according to claim 1, wherein straight lines formed by joining the respective arrays of said plural first and second peripheral dummy transistors to each other intersect each other at right angles in plan view.

5. A semiconductor device according to claim 1, wherein straight lines formed by joining the respective arrays of said plural first and second peripheral dummy transistors to each other intersect each other at acute angles in plan view.

6. A semiconductor device according to claim 1, wherein at least some of said plural first and second peripheral dummy transistors are arranged so that said peripheral n-type dummy gate structure and said peripheral p-type dummy gate structure may be adjacent to each other in plan view.

* * * * *